US008943889B2

(12) United States Patent
Bonnat

(10) Patent No.: US 8,943,889 B2
(45) Date of Patent: Feb. 3, 2015

(54) MEMS/MOEMS SENSOR DESIGN

(76) Inventor: Pierre Bonnat, Las Vegas, NV (US)

( * ) Notice: Subject to any disclaimer, the term of this patent is extended or adjusted under 35 U.S.C. 154(b) by 317 days.

(21) Appl. No.: 13/348,537

(22) Filed: Jan. 11, 2012

(65) Prior Publication Data

US 2012/0186338 A1 Jul. 26, 2012
US 2014/0311238 A9 Oct. 23, 2014

Related U.S. Application Data

(63) Continuation-in-part of application No. 12/055,999, filed on Mar. 26, 2008, and a continuation-in-part of application No. 12/056,203, filed on Mar. 26, 2008.

(60) Provisional application No. 61/431,716, filed on Jan. 11, 2011, provisional application No. 61/436,506, filed on Jan. 26, 2011.

(51) Int. Cl.
| | | |
|---|---|---|
| *G01F 3/12* | (2006.01) | |
| *G01F 15/00* | (2006.01) | |
| *G01F 15/06* | (2006.01) | |
| *G01P 5/04* | (2006.01) | |
| *G01P 13/00* | (2006.01) | |

(52) U.S. Cl.
CPC .............. *G01P 5/04* (2013.01); *G01P 13/0026* (2013.01); *G01P 13/0033* (2013.01)
USPC ................... 73/272 R; 73/861.08; 73/861.39

(58) Field of Classification Search
CPC .................................. G01F 3/12; G01F 1/64

USPC .............................. 73/272 R, 861.39, 861.08
See application file for complete search history.

(56) References Cited

U.S. PATENT DOCUMENTS

| | | | |
|---|---|---|---|
| 4,440,030 A | 4/1984 | Pounder | |
| 2002/0131458 A1* | 9/2002 | Sirbu et al. | 372/20 |
| 2003/0214304 A1* | 11/2003 | Karinka et al. | 324/444 |
| 2004/0231432 A1 | 11/2004 | Clark | |
| 2006/0221114 A1 | 10/2006 | Silverbrook | |
| 2007/0095129 A1* | 5/2007 | Donaldson et al. | 73/53.01 |
| 2008/0314140 A1* | 12/2008 | Ueda et al. | 73/272 R |
| 2009/0241686 A1 | 10/2009 | Bonnat | |
| 2010/0100052 A1 | 4/2010 | Eckhardt | |
| 2010/0252899 A1 | 10/2010 | Glenn | |

OTHER PUBLICATIONS

PCT, Notification of Transmittal of the International Search Report and the Written Opinion of the International Searching Authority, or the Declaration, in International application No. PCT/US2012/020976, dated May 11, 2012 (9 pages).

PCT Notification Concerning Transmittal of International Preliminary Report on Patentability, in International application No. PCT/US2012/020976, dated Jul. 25, 2013. (5 pages).

* cited by examiner

*Primary Examiner* — Lisa Caputo
*Assistant Examiner* — Philip Cotey
(74) *Attorney, Agent, or Firm* — McAndrews, Held & Malloy, Ltd.

(57) ABSTRACT

A MEMS/MOEMS sensor and method for using such sensor to detect a person's breath or other fluid for purposes of controlling a user interface of an electronic device.

20 Claims, 19 Drawing Sheets

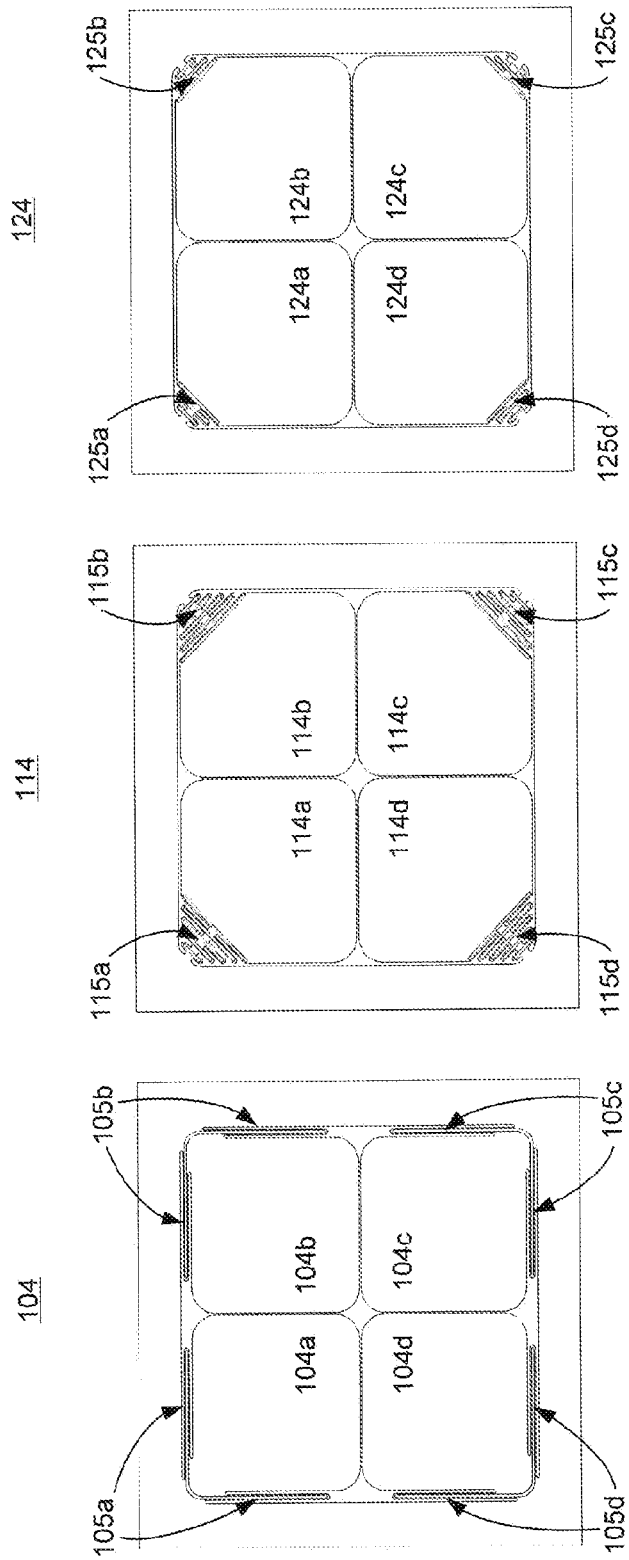

US 8,943,889 B2

MEMS/MOEMS SENSOR DESIGN

CROSS-REFERENCE TO RELATED APPLICATIONS/INCORPORATION BY REFERENCE

The present application makes reference to, claims priority to, and claims benefit of U.S. Provisional Patent Application No. 61/431,716, entitled "MEMS/MOEMS SENSOR DESIGN," filed Jan. 11, 2011; and U.S. Provisional Patent Application No. 61/436,506, entitled "BREATH SENSITIVE DIGITAL INTERFACE," filed Jan. 26, 2011; and is a continuation-in-part of U.S. patent application Ser. No. 12/055,999, entitled "METHOD AND SYSTEM FOR A MEMS DETECTOR THAT ENABLES CONTROL OF A DEVICE USING HUMAN BREATH," filed Mar. 26, 2008; and U.S. patent application Ser. No. 12/056,203, entitled "METHOD AND SYSTEM FOR PROCESSING SIGNALS FOR A MEMS DETECTOR THAT ENABLES CONTROL OF A DEVICE USING HUMAN BREATH," filed Mar. 26, 2008. The present application also makes reference to U.S. patent application Ser. No. 10/530,946, entitled "METHOD OF CONTROLLING AN ELECTRONIC COMPUTER SYSTEM," filed Oct. 9, 2003.

The complete subject matter of each of the above is hereby incorporated herein by reference, in its respective entirety.

FIELD OF THE INVENTION

Certain embodiments of the invention relate to a system for controlling digital media. More specifically, certain embodiments of the invention relate to a sensor used in a microelectromechanical system ("MEMS") or micro-opto-electromechanical system ("MOEMS") that uses a fluid, such as a person's breath, to interface between the person and digital media.

BACKGROUND OF THE INVENTION

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A device, method, and/or system is provided for a MEMS/MOEMS sensor, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 10 is an illustration of a membrane layer having four paddles with corresponding spring elements of a first exemplary arrangement, in accordance with one representative embodiment of the present invention.

FIG. 11 is an illustration of a membrane layer having four paddles having corresponding spring elements of a second exemplary arrangement different from that of FIG. 10, in accordance with another representative embodiment of the present invention.

FIG. 12 is an illustration of a membrane layer having four paddles having corresponding spring elements of a third exemplary arrangement different from that of those of FIGS. 10 and 11, in accordance with yet another representative embodiment of the present invention.

DETAILED DESCRIPTION OF THE INVENTION

Figure 1A:
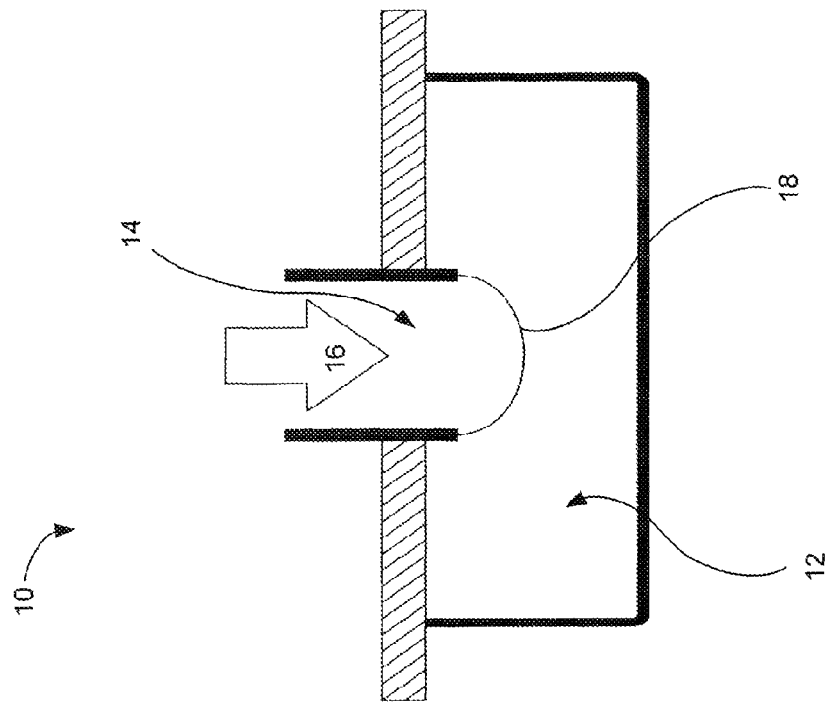
FIG. 1A shows an illustration of an exemplary device comprising a hermetically sealed chamber separated from an adjoining cavity (which may be open to atmospheric pressure depending on the aim of the sensor) that channels a fluid or breath towards a deformable media.

Certain embodiments of the invention may be found in a MEMS/MOEMS sensor or a method of sensing using such a sensor to detect flow of a fluid. More specifically, representative embodiments of the present invention may be found in a device, system, and method for sensing the flow of a fluid, such as the exhaled breath of a user, where the user is in proximity to, but not connected by a channel to, the sensing device, to control a user interface of an electronic device.

Various embodiments of the current invention provide a user the ability to interface with digital media using a fluid such as the user's breath. For example, a MEMS/MOEMS sensor, as described more fully below, may be positioned in the proximity of the user's mouth (e.g., 5 to 10 centimeters or more, depending on functions, whether pointing or scrolling, flicking, zooming, etc.), which allows the user to effortlessly breathe towards the sensor, either continuously or in "puffs," while accurately controlling the direction of his or her breath over, at, or across a confined area (e.g., in the order of a $cm^2$). It should be noted that in a representative embodiment of the present invention, the flow of fluid or breath need not be constrained to a channel in its path between the source and the sensor, but is suitable for use in situations where fluid such as human breath travels across an open space between the user and the sensor.

The presence and dynamics of the user's breath may then be sensed and converted to an electronic signal, which may be used to facilitate control of digital media. Such use of a user's breath for control has a variety of applications, such as providing an additional layer of interaction to current touch-control methods. For example, the current system may enhance touch functionality (e.g., avoid occlusion of displayed content while scrolling or zooming, or alleviate the use of "curtain effect"-based menus), enable functions that cannot be enabled via touch interaction or where touch interaction vocabulary is already maxed out, or absolutely requires double handed interaction (e.g. scroll long lists). It may also be used as a standalone form as well.

Sensors in accordance with various representative embodiments of the present invention may be used in, for example, toys and games, productivity input devices for personal computers, novel interaction devices for "all-in-one" PCs, and in systems to improve in-vehicle safety. Possible conversion techniques and applications are disclosed in some of Applicant's prior patents and patent applications. Prior patent applications and patents include U.S. Provisional Patent Application No. 61/431,716, entitled "MEMS/MOEMS SENSOR DESIGN," filed Jan. 11, 2011, U.S. Provisional Patent Application No. 61/436,506, entitled "BREATH SENSITIVE DIGITAL INTERFACE," filed Jan. 26, 2011, U.S. patent application Ser. No. 10/530,946, entitled "METHOD OF CONTROLLING AN ELECTRONIC COMPUTER SYSTEM," filed Oct. 9, 2003, and U.S. patent application Ser. No. 12/056,203, entitled "METHOD AND SYSTEM FOR PROCESSING SIGNALS FOR A MEMS DETECTOR THAT ENABLES CONTROL OF A DEVICE USING HUMAN BREATH," filed Mar. 26, 2008, which are hereby incorporated herein, in their respective entireties.

The present patent application describes Applicant's novel sensor, which may be used with the system described above. In one embodiment, the MEMS/MOEMS sensor enables detection of the amount and direction of low pressure. More specifically, the sensor is highly sensitive in usage scenarios where it is positioned at a distance from the source (e.g., the user's mouth), and is able to detect very small changes in pressure, often for very limited durations, with great accuracy at very low pressures in open space in a variety of environmental conditions (such as those under which a user must be enabled to use their cell phone). This sensor may measure deflection or strain resulting from small applied pressure over a small area, for a short duration, and with weak dynamic pressures. Thus, tiny deformations/deflections/vibrations/oscillations for a very short duration may need to give rise to large changes in output.

In addition, the sensor may be able to detect directional sensing, that is, the sensor's small sensing area allows it to derive the direction in which a user is exhaling, corresponding to an interaction (e.g., scroll down). As described in more detail below, the current solution may use several sensors embedded within the MEMS/MOEMS to derive the flow direction by measuring the geometry change of the sensing mechanism, even when the direction of the air/fluid flow is not perfectly perpendicular to the sensor. In a representative embodiment of the present invention, each sensing element within the MEMS/MOEMS may experience motion with five or even six degrees of freedom.

FIG. 1A shows an illustration of an exemplary device 10 comprising a hermetically sealed chamber 12 separated from an adjoining cavity 14 (which may be open to atmospheric pressure depending on the aim of the sensor) that channels a fluid or breath 16 towards a deformable media 18. In the illustration of FIG. 1A, the pressure of the fluid or breath 16 in the cavity 14 is substantially equal to that in the sealed chamber 12, and the deformable media 18 is not subject to a significant pressure difference that causes deformation.

Figure 1B:
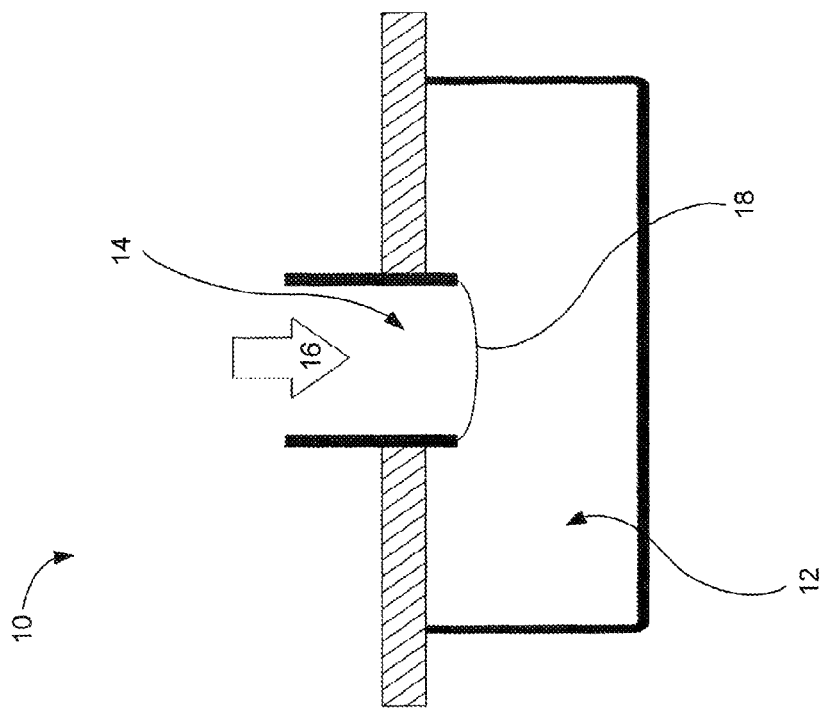
FIG. 1B shows another illustration of the exemplary device of FIG. 1A in which the pressure of fluid or breath in the cavity is substantially above that of the sealed chamber, causing significant deformation of the deformable media.

FIG. 1B shows another illustration of the exemplary device 10 of FIG. 1A in which the pressure of fluid or breath in the cavity 14 is substantially above that of the sealed chamber 10, causing significant deformation of the deformable media 18. While such a configuration is commonly used today, this design may not be suited for use in the present system. Flow sensing may also be implemented using the Venturi effect to measure differential pressure between two segments of a Venturi tube—almost always relatively small levels.

There are several conventional pressure sensors that use a variety of materials including, for example, piezoelectric materials, films, diaphragms, electromagnetic media, or optical media. These sensors, however, are typically not ideal for directional measurement, nor do they typically allow for measurement of pressure levels under the conditions described above (i.e., open space, short duration, low pressure over a small area, etc.). For example, piezoelectric sensors are typically used to measure highly dynamic pressures, and may require a substantial sensing area, whereas thin film resistors having the appropriate specifications may be too expensive to meet the target cost per unit for the consumer electronics market. Also, the performance of such sensors may be minimized by vibrations caused by the close proximity and integration into one small package, or may not be immune enough to electromagnetic interference to be easily marketed as components for integration into high density circuit boards, such as those seen in today's smart phones and other handheld electronics.

Notwithstanding the disadvantages mentioned above, any available sensing mode may be possibly utilized in connection with the present system as described below. For example, and in addition to electromagnetic, piezoelectric and other such established methods, the present system may be designed as a resonant system where changes in resonant frequency convert the stress caused by the applied pressure into interaction signals.

Figure 2A:
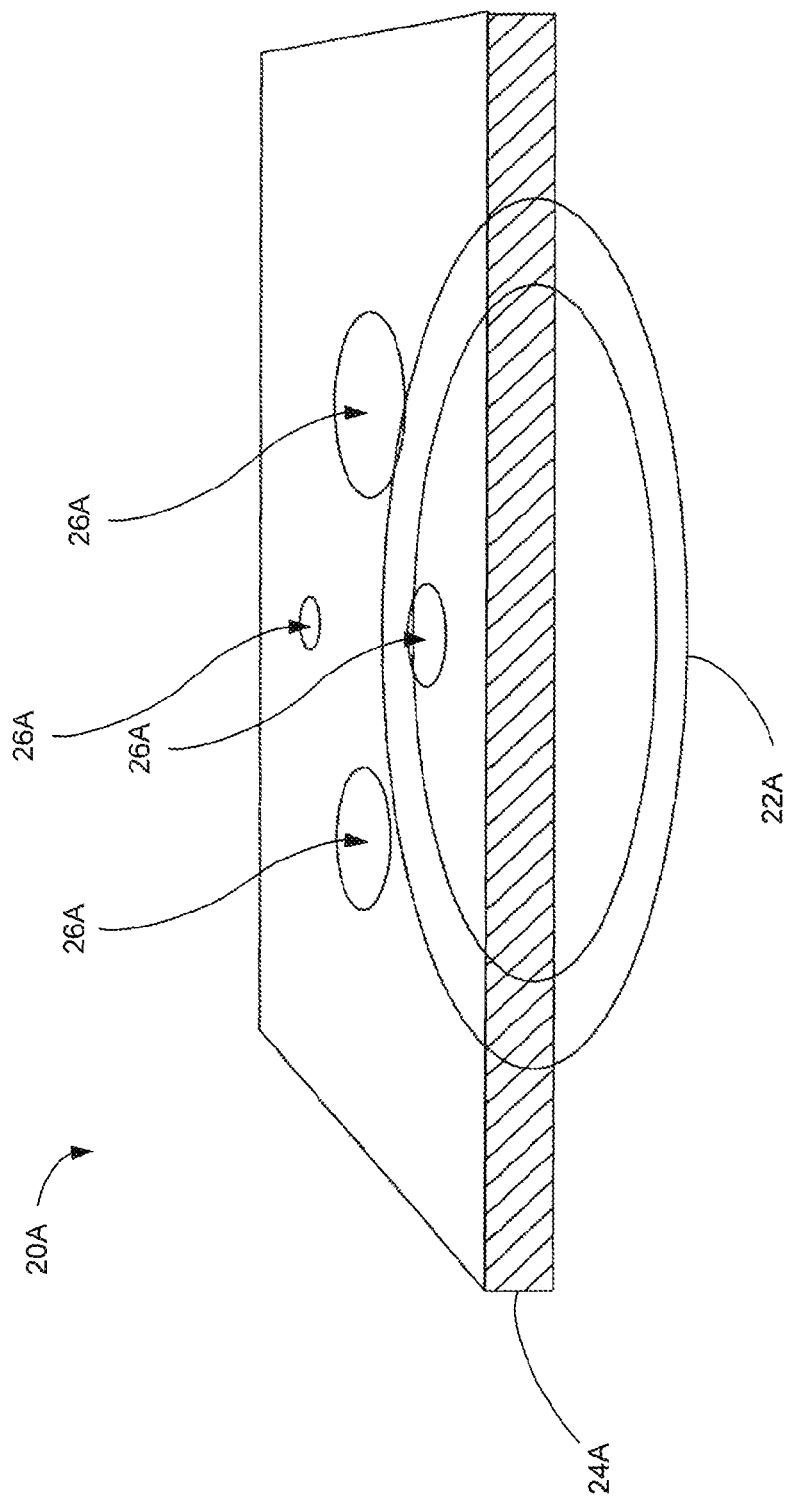
FIG. 2A illustrates an exemplary resonant sensor in which changes in resonant frequency of the sensor result from changes in applied pressure, in accordance with a representative embodiment of the present invention.

FIG. 2A illustrates an exemplary resonant sensor 20A in which changes in resonant frequency of the sensor result from changes in applied pressure, in accordance with a representative embodiment of the present invention. As shown in FIG. 2A, one embodiment of a resonant sensor may consist of a diaphragm/membrane 22A of suitable dimensions, being stressed by an applied pressure 24A through tiny holes 26A of distinct sizes/diameters, so as to enable directional sensing. Another variation of the resonant sensing system is to measure the speed of sound using a similar design. Such resonant directional sensors could use vibrating wires and other media as well.

Figure 2B:
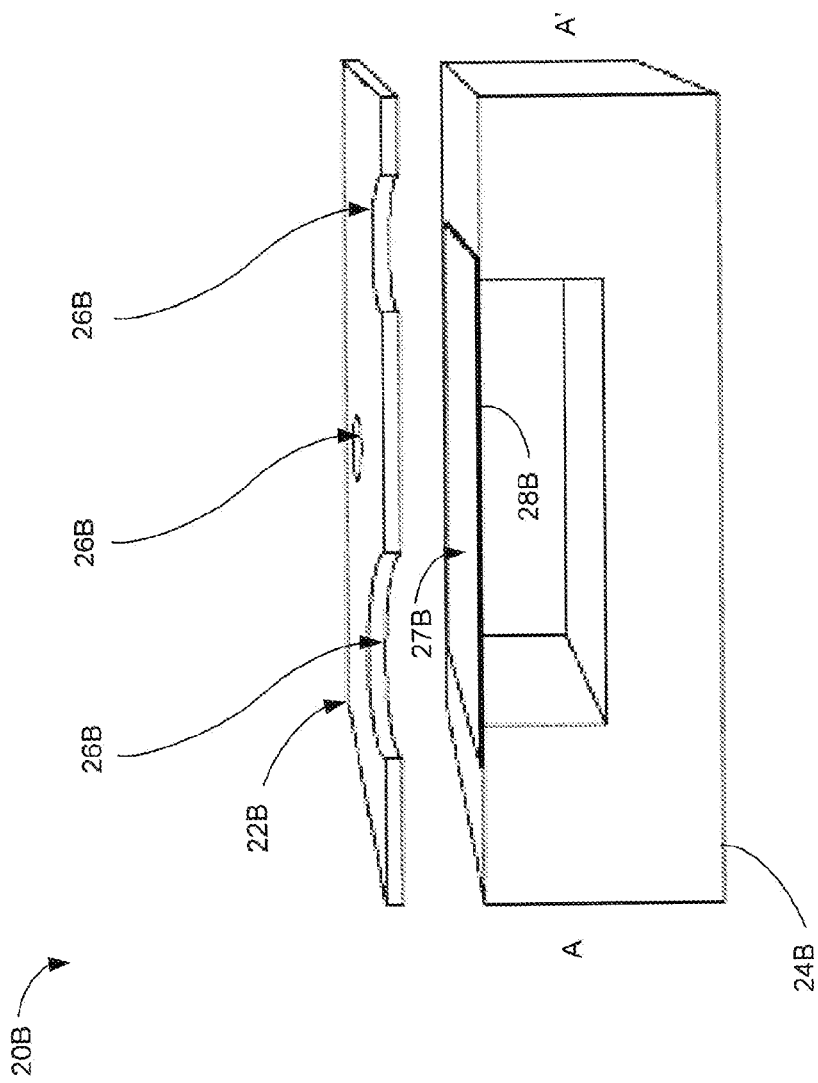
FIG. 2B illustrates a cut-away view of another exemplary resonant sensor, in accordance with a representative embodiment of the present invention.

FIG. 2B illustrates a cut-away view of another exemplary resonant sensor 20B, in accordance with a representative embodiment of the present invention. As shown in FIG. 2B, the sensor 20B comprises a cover or lid 22B with multiple openings 26B of varying sizes, and a substrate 24B with piezoelectric material 28B with electrodes placed on the edge of the membrane 27B. The membrane 27B may be an electrode, as will be defined by state of the art processes. Various geometrical arrangements may be implemented, whether through inlets of various sizes/diameters in package top, or through members of distinct sizes, and hence of differentiated responsiveness.

Figure 2C:
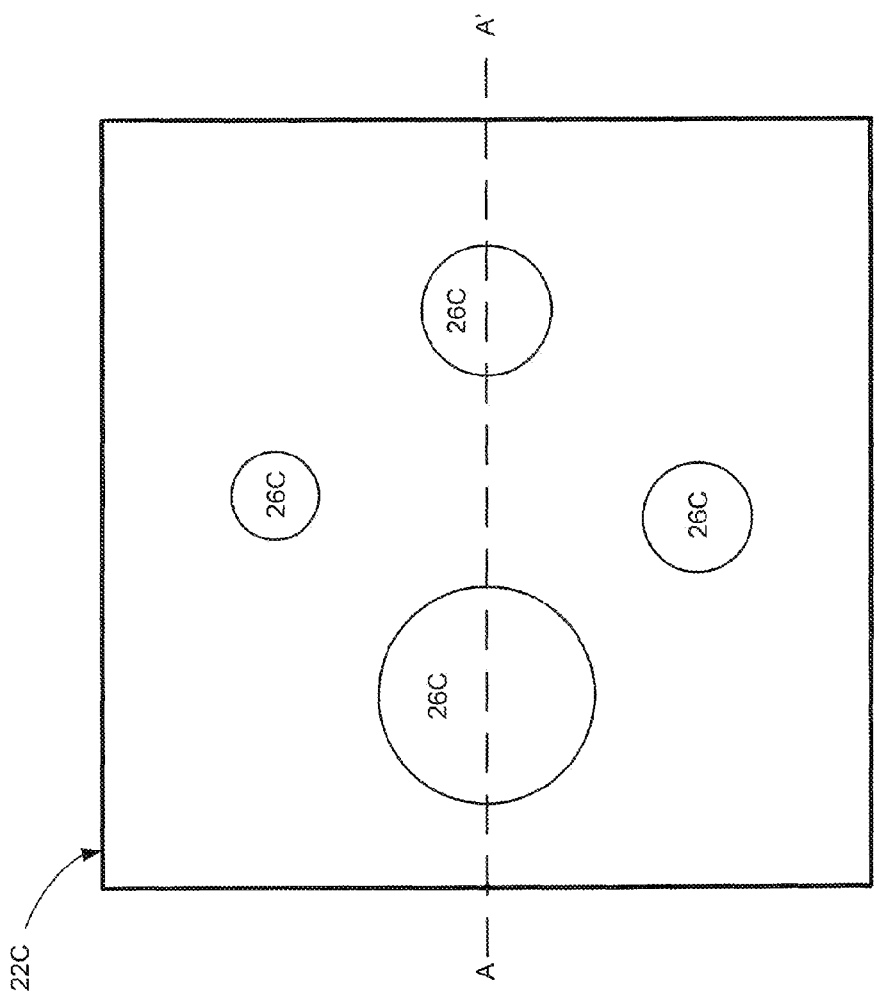
FIG. 2C illustrates a top view of a cover or lid of an exemplary resonant sensor that may correspond to, for example, the resonant sensor of FIG. 2B, in accordance with a representative embodiment of the present invention.

FIG. 2C illustrates a top view of a cover or lid 22C of an exemplary resonant sensor that may correspond to, for example, the resonant sensor 20B of FIG. 2B, in accordance with a representative embodiment of the present invention. The cover or lid 22C is arranged with openings or inlets 26C, that may correspond to the openings or inlets 26B of FIG. 2B.

Figure 2D:
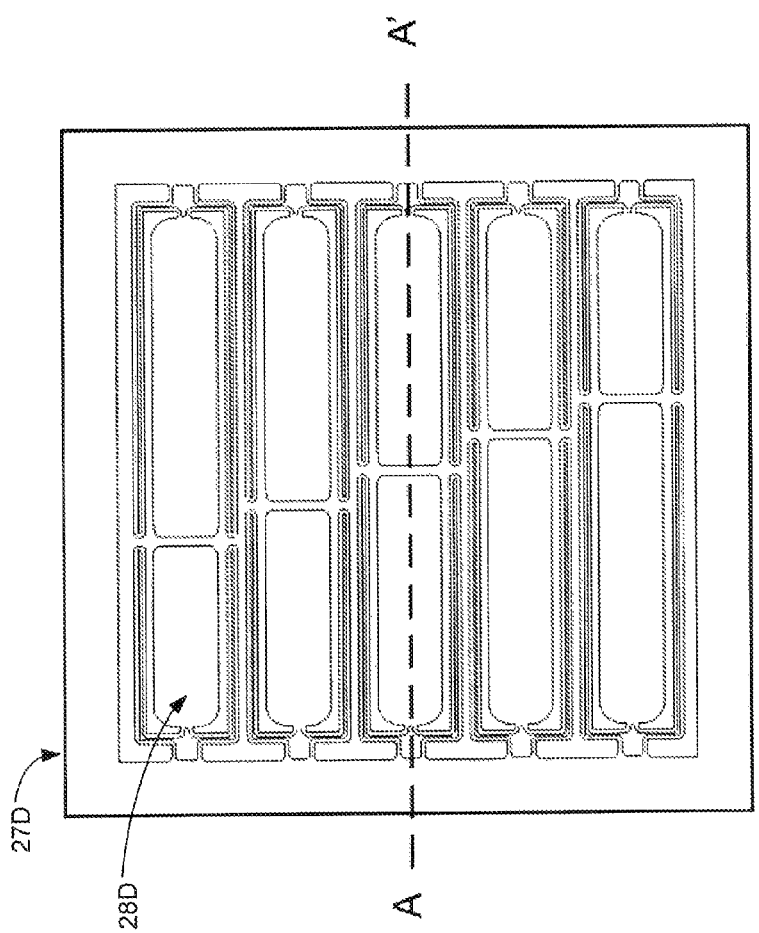
FIG. 2D illustrates a top view of a membrane with piezoelectric material of an exemplary resonant sensor that may correspond to, for example, the resonant sensor of FIG. 2B, in accordance with a representative embodiment of the present invention.

FIG. 2D illustrates a top view of a membrane 27D with piezoelectric material 28D of an exemplary resonant sensor that may correspond to, for example, the resonant sensor 20B of FIG. 2B, in accordance with a representative embodiment of the present invention.

Figure 2E:
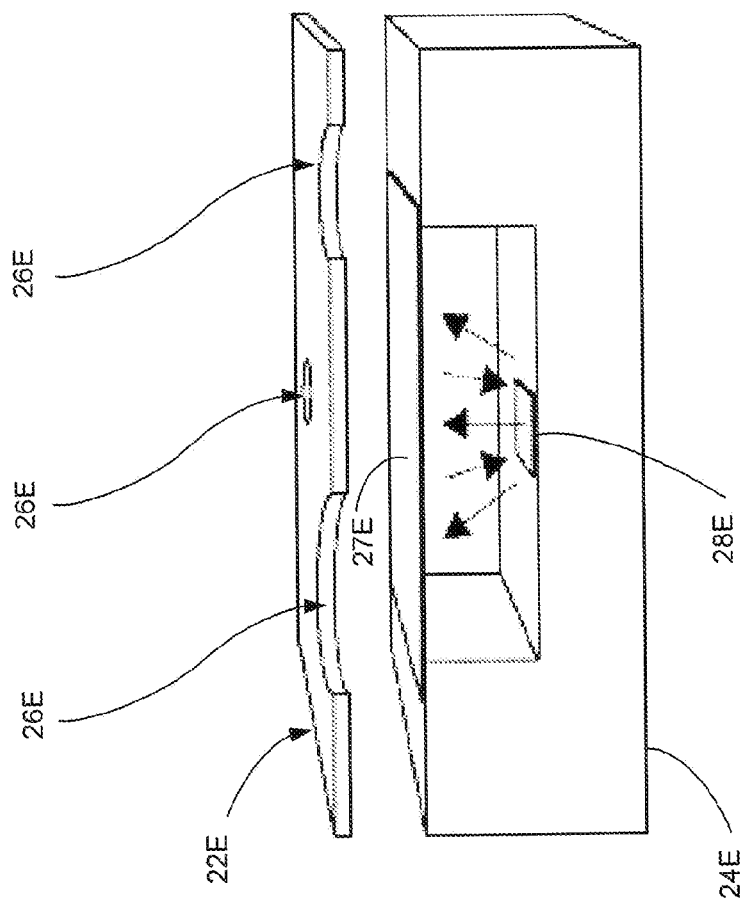
FIG. 2E illustrates another exemplary sensor employing an interferometer-type design in which the light source and receiver may be a single device, in accordance with a representative embodiment of the present invention.

FIG. 2E illustrates another exemplary sensor 20E employing an interferometer-type design in which the light source and receiver may be a single device, in accordance with a representative embodiment of the present invention. As shown in FIG. 2E, the sensor 20E comprises a cover or lid 22E with multiple openings 26E of varying sizes, a membrane 27E, and a substrate 24E with a light source and receiver 28E, that may be single device, possibly powered by a single optical fiber with a lense at its end to ensure optimal illumination of the largest possible area within the membrane 27E, while refocusing reflected signals.

Another embodiment could employ thermal sensing by combining calibrated temperature sensors assembled and properly isolated so as to detect airflow direction by offsetting their outputs.

Another embodiment could employ several sensors of suitable sensitivity and response time positioned, for example, at N, S, E and W points around the edge of a display. Such an embodiment may not need each and every of these several sensors to be able to sense directionality, and may only detect presence/absence of significant airflow.

Figure 3:
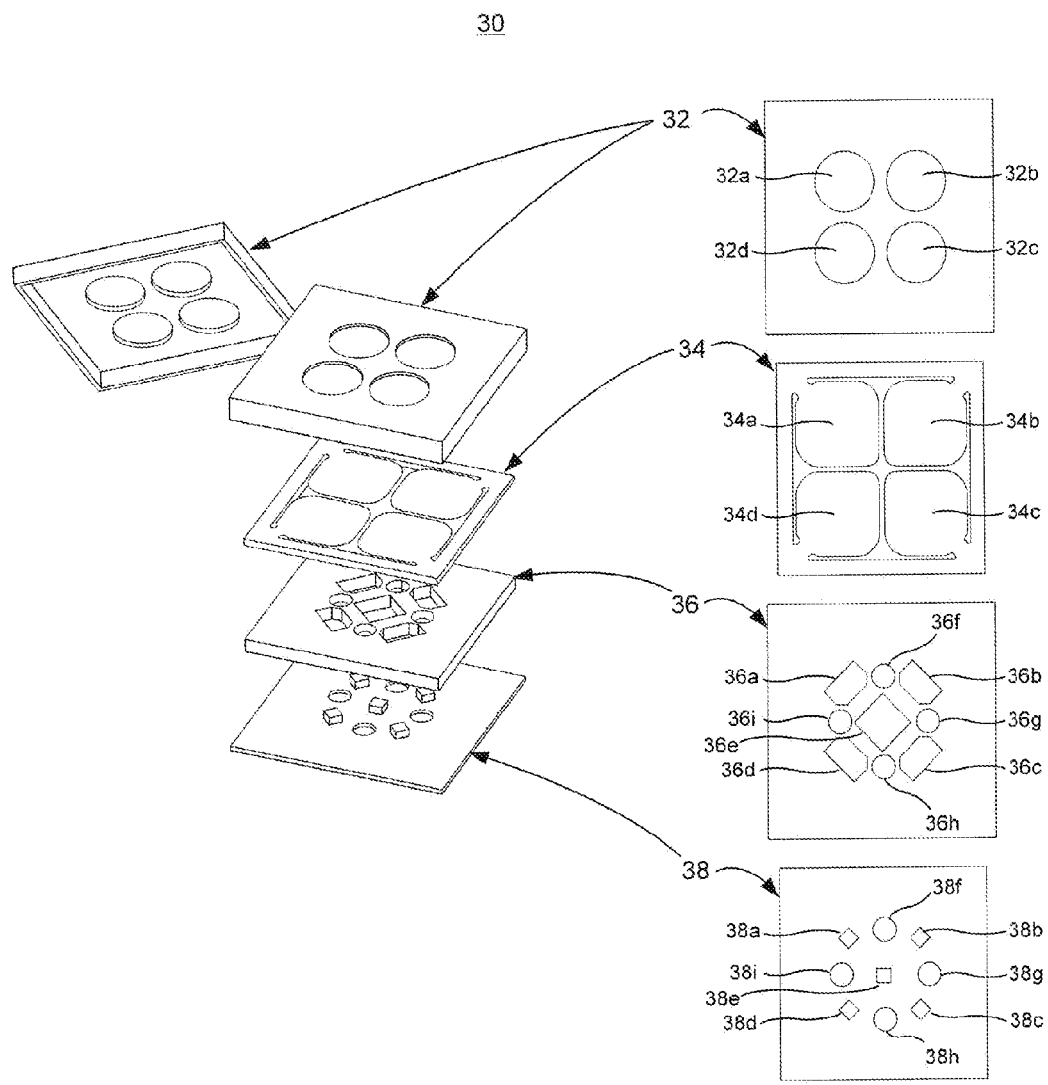
FIG. 3 illustrates a view of one exemplary arrangement of a sensor that implements cantilever displaceable reflective elements and optical sources/receivers, in accordance with a representative embodiment of the present invention.

FIG. 3 illustrates a view of one exemplary arrangement of a sensor 30 that implements cantilever displaceable reflective elements and optical sources/receivers, in accordance with a representative embodiment of the present invention. The exemplary sensor 30 of FIG. 3 comprises four main components that include a package or lid 32, a membrane layer 34, a cavities layer 36, and an electrical or processing layer 38.

Figure 4:
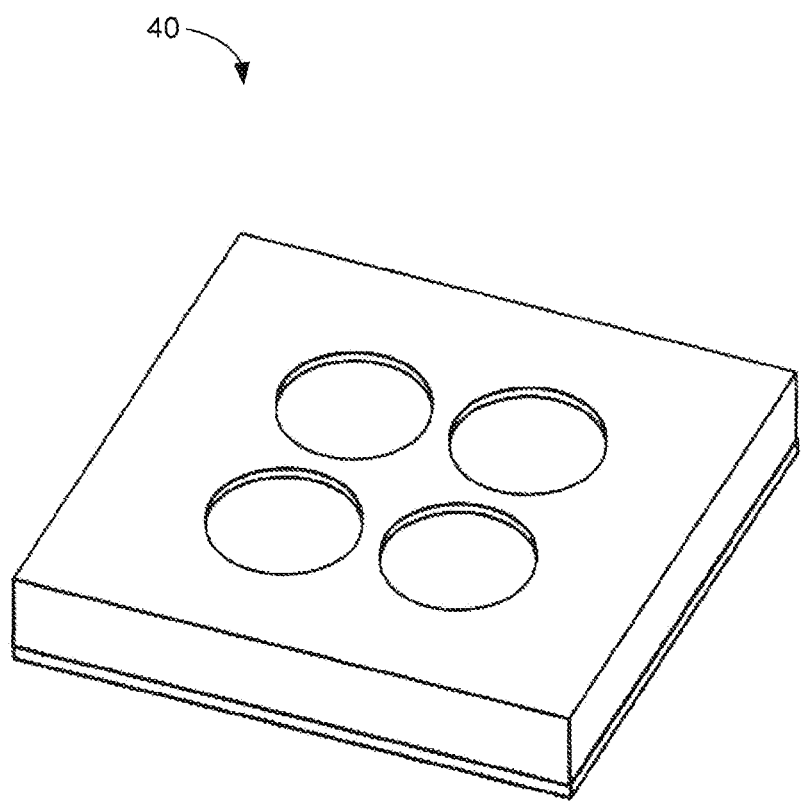
FIG. 4 is an illustration of an exemplary, fully-assembled and packaged sensor that may correspond, for example, to the completed assembly of the elements of the exemplary sensor of FIG. 3, in accordance with a representative embodiment of the present invention.

The package or lid 32 of the exemplary sensor 30 of FIG. 3 acts to enclose and protect the membrane layer 34, the cavities layer 36, and the electrical or processing layer 38, arranged as shown in FIG. 4. As illustrated in FIG. 3, the package or lid 32 has been fabricated to have four openings 32a, 32b, 32c, 32d, through which the sensed fluid or breath passes to the membrane layer 34, described below.

The membrane layer 34 of the exemplary sensor 30 of FIG. 3 comprises four cantilever displaceable reflective elements 34a, 34b, 34c, 34d, which are also referred to herein as "paddles." Each of the four paddles 34a, 34b, 34c, 34d have one of two faces exposed to the direct flow of the sensed fluid, and are supported from the edge or frame of the membrane layer 34 in cantilever fashion by a corresponding spring element 35a, 35b, 35c, 35d. The paddles 34a, 34b, 34c, 34d of the membrane layer 34 have substantially the same surface area exposed to the flow of the fluid, are positioned in substantially the same plane, and are aligned with corresponding openings 32a, 32b, 32c, 32d in the package or lid 32, to permit the flow of fluid or breath through each opening to disturb or deflect one or more of the four paddles 34a, 34b, 34c, 34d from the resting or idle state that exists without fluid flow.

In some representative embodiments of the present invention, the thickness of the frame element of the membrane layer 34, which supports the paddles 34a, 34b, 34c, 34d, is distinct from that of the paddles 34a, 34b, 34c, 34d, and may define the travel of the paddles 34a, 34b, 34c, 34d. In various representative embodiments, the processes used in fabrication of the membrane layer 34 (e.g., Silicon etching) may permit the thickness of portions of the membrane layer 34 to be tailored such as, for example, to allow the thickness of the spring elements 35a, 35b, 35c, 35d to progressively decrease, or permit the edge of each the paddles 34a, 34b, 34c, 34d to be thicker than other portions, for better control over paddle inertia.

The cavities layer 36 of the exemplary sensor 30 of FIG. 3 is positioned immediately below and is aligned with features of the membrane layer 34. The cavities layer 36 shown in FIG. 3 comprises a center cavity 36e and four surrounding cavities 36a, 36b, 36c, 36d spaced about the center cavity 36e. The cavities layer 36 provides spacing between the membrane layer 34 and the electrical or processing layer 38, and optical isolation between the center cavity 36e and the four surrounding cavities 36a, 36b, 36c, 36d, and between each of the four cavities 36a, 36b, 36c, 36d and the others of cavities 36a, 36b, 36c, 36d. In addition, the cavities layer 36 of FIG. 3 includes four vents 36f, 36g, 36h, 36i, which permit fluid or breath that passes around the paddles 34a, 34b, 34c, 34d of the membrane layer 34 to pass from beneath the paddles of the membrane layer 34 through the cavities layer 36 on its way out of the sensor 30. It should be noted that although the illustration of FIG. 3 shows the center cavity 36e and the four surrounding cavities 36a, 36b, 36c, 36d as having a polygonal cross-section, that does not necessarily represent a specific limitation of a representative embodiment of the present invention. A representative embodiment of the present invention may employ cavities in which the cross-sectional shape is round, in that it may be more cost-efficient to drill cylindrical cavities that to build cavities of other shapes, and the consistency in terms of the cavity geometry may be more consistent.

In addition, the exemplary sensor 30 of FIG. 3 comprises an electrical or processing layer 38 that is positioned immediately below and is aligned with features of the cavities layer 36. The electrical or processing layer 38 of FIG. 3 comprises an infrared (IR) source 38e, positioned to align with the center cavity 36e of the cavities layer 36, and four IR receivers 38a, 38b, 38c, 38d that are arranged to align with four corresponding cavities 36a, 36b, 36c, 36d of the cavities layer 36. Each of the IR receivers 38a, 38b, 38c, 38d may include, for example, an IR sensitive phototransistor or IR sensitive photodiode. In addition, the electrical or processing layer 38 comprises four vents 38f, 38g, 38h, 38i that align with vents 36f, 36g, 36h, 36i of the cavities layer 36, to permit fluid or breath to exhaust through the electrical or processing layer 38 and out and away from the sensor 30. It should be noted that although the exemplary sensor of FIG. 3 employs an optical means to detect paddle movement or deflection due to fluid flow, this is not necessarily a specific limitation of the present invention, as other means may be employed to measure or detect the effects of the flow of the sensed fluid elements of the sensor 30.

In one representative embodiment of the present invention, the electrical or processing layer 38 may be fabricated using FR-4 material on which the infrared (IR) source 38e and four IR receivers 38a, 38b, 38c, and 38d are bare die that are attached so as to align with the respective five cavities 36e, 36a, 36b, 36c, 36d of the cavities layer 36, when assembled. The electrical or processing layer 38 of such a sensor may have metallic contacts on the surface opposite that to which the infrared (IR) source 38e and phototransistors or photodiode receivers 38a, 38b, 38c, 38d are attached, resulting in a sensor that may be attached as a surface mount device (SMD) to a printed circuit board (PCB) of a system of which the sensor 30 is a part.

Figure 9:
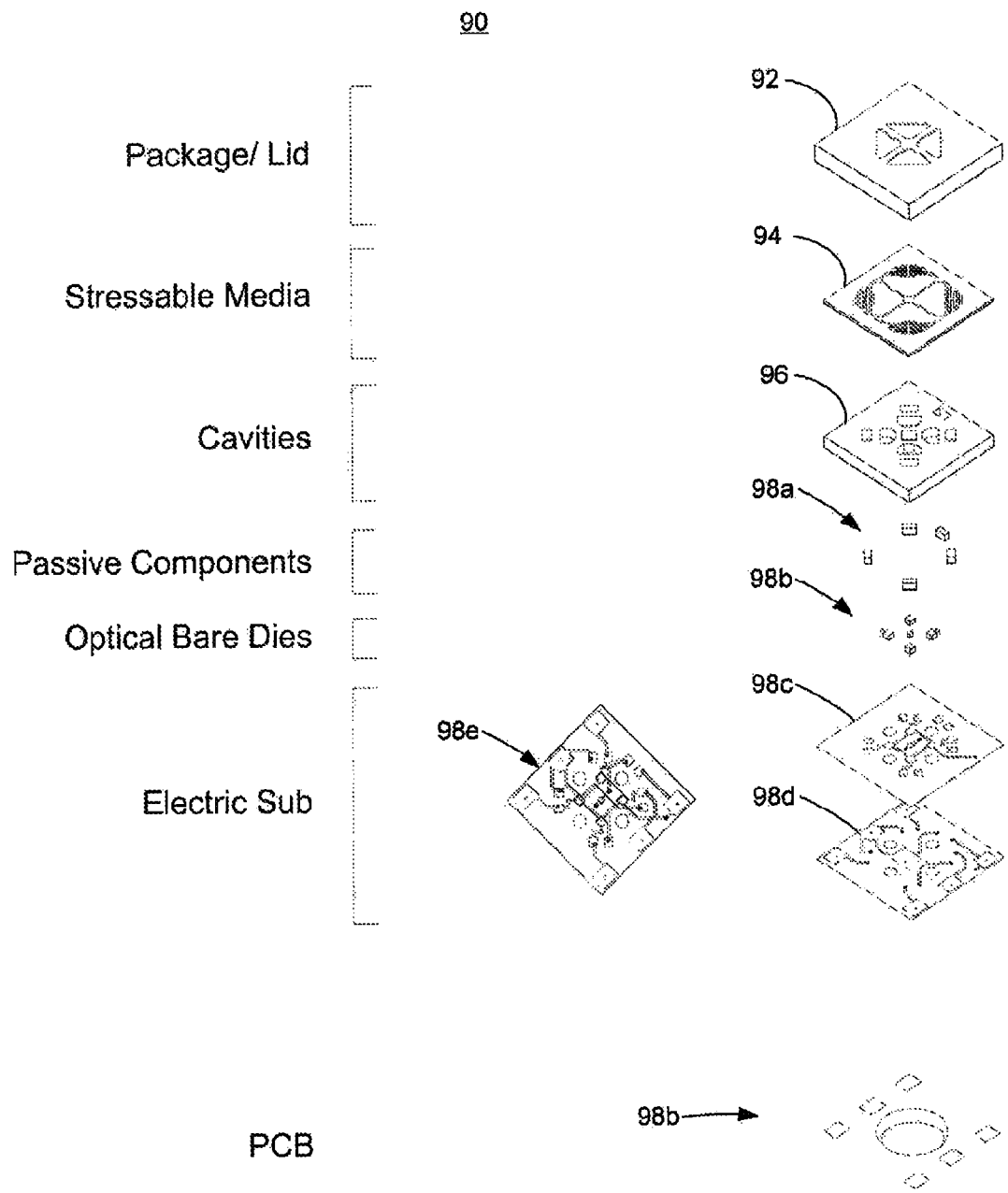
FIG. 9 illustrates another exemplary arrangement of a sensor for detecting the flow of fluid or breath, in accordance with a representative embodiment of the present invention.

It should be noted that although the illustration of FIG. 3 shows a sensor 30 having four paddles 34a, 34b, 34c, 34d, the example embodiment is only for purposes of illustration, and does not necessarily represent a specific limitation of the present invention, as a representative embodiment of the present invention may have a greater or lesser number of displaceable elements or paddles, and corresponding features of the other layers described above, without departing from the spirit and scope of the present invention. It should also be noted that, as described above, representative embodiments of the present invention may be realized by sensing flow without the use of movable elements. Another exemplary design and configuration similar to that shown in FIG. 3, is shown in FIG. 9, which is described below.

It should again be noted that a device for sensing the flow of a fluid or breath in accordance with a representative embodiment of the present invention may use means other than the displaceable reflective elements 34a, 34b, 34c, 34d of the exemplary sensor 30 of FIG. 3, as mentioned above with respect to FIG. 2.

In some representative embodiments, the features of the layers 34, 36, 38 of the exemplary sensor 30 of FIG. 3 may all be fabricated at once (e.g., using silicon micromachining, etching, doping, etc.), or may result from the assembly of several distinct elements. For example, the system may be fabricated with a membrane element on top of a substrate element, in which light sources and receivers as bare die are isolated in distinct cavities and encapsulated (such as with IR light transparent gel or other materials known to those skilled in the art) to be protected from condensation, dust, etc. To facilitate production, the MEMS/MOEMS sensor in accordance with the present invention may also be able to withstand the usual solder reflow/washing process for surface mount devices (SMD), and integration into other devices or systems. For some representative embodiments of the present invention, adhesive films may be applied to protect the inlets of the MEMS/MOEMS sensor during some assembly steps that may generate contaminants. Such adhesive film may be peeled off of the MEMS/MOEMS sensor at a later stage of assembly process.

In fabricating a MEMS/MOEMS, one may take into consideration the costs related to some fabrication techniques (e.g., Si/CMOS), the need for costly tooling (for some molding methods), and the ability to easily customize the product to market demand. This may be especially important given that the embodiments of the current invention may apply to several market areas with different practices. Suitable manufacturing methods include, but are not limited to, fabricating the system using Silicon/GaAs doping/CMOS techniques, or in LTCC (Low Temperature Co-fired Ceramics), with inked passives, or based on a traditional substrate, such as a laminate or ceramic, combined with electroformed mechanical elements. This manufacturing approach/procedure allows for seamless porting in light of customer's different specifications and requirements, for example, the inclusion of an integrated application specific integrated circuit (ASIC). This manufacturing approach/procedure also allows for production in high volumes.

FIG. 4 is an illustration of an exemplary, fully-assembled and packaged sensor 40 that may correspond, for example, to the completed assembly of the elements of the exemplary sensor 30 of FIG. 3, in accordance with a representative embodiment of the present invention. The MEMS/MOEMS may have an unobtrusive, low profile and small footprint, possibly on the order of 1 $cm^2$, so that it may be easily embedded in target devices.

Figure 5:
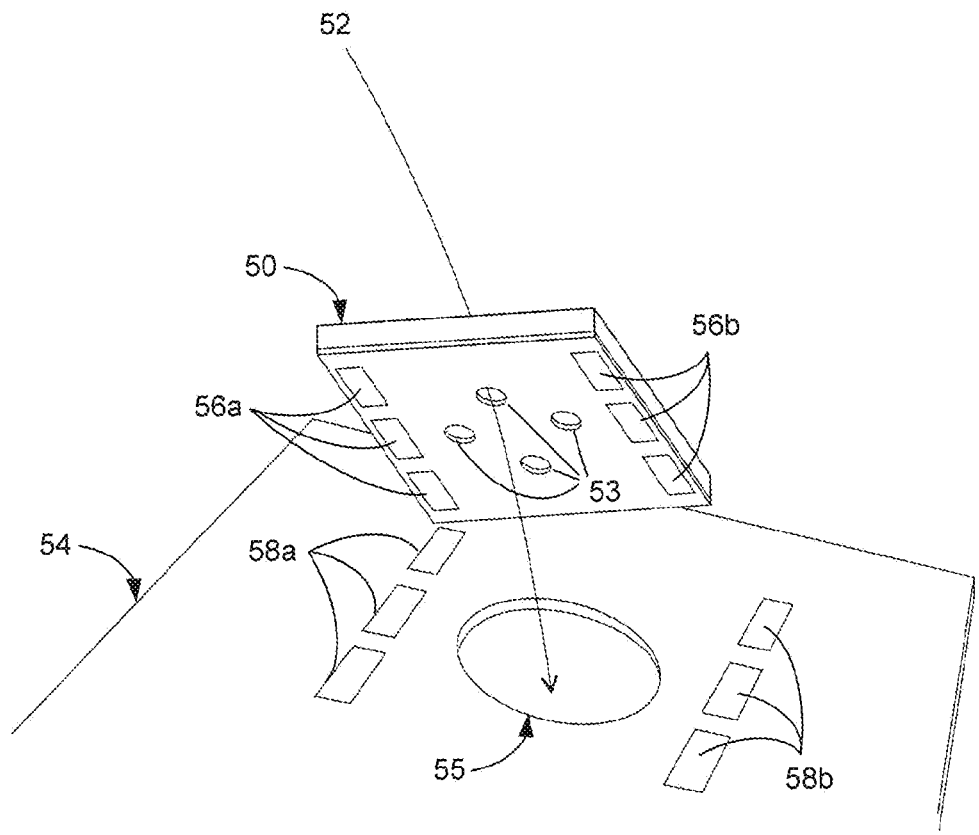
FIG. 5 illustrates an exemplary mounting arrangement in which a sensor, which may correspond, for example, to the sensor of FIG. 3 or the sensor of FIG. 4, may be surface mounted on any printed circuit board, in accordance with a representative embodiment of the present invention.

FIG. 5 illustrates an exemplary mounting arrangement in which a sensor 50, which may correspond, for example, to the sensor 30 of FIG. 3 or the sensor 40 of FIG. 4, may be surface mounted on any printed circuit board, in accordance with a representative embodiment of the present invention. The illustration of FIG. 5 shows a sensor 50 being placed so as to align metallic contacts 56a, 56b on the underside of the sensor 50 with metallic contacts 58a, 58b on the PCB 54. It should be noted that although the metallic contacts 56a, 56b, 58a, 58b of FIG. 5 are illustrated as being rectangular in shape, this is not necessarily a specific limitation of a representative embodiment of the present invention, as the metallic contacts 56a, 56b, 58a, 58b may be other shapes (e.g., round) as well.

A representative embodiment of the present invention may be mounted to a PCB using, for example, ball-grid array (BGA) assembly.

In the illustration of FIG. 5, the PCB 54 onto which the sensor 54 is to be mounted has been provided with a hole 55 that aligns with the exhausts or vents 53 of the sensor 50, to permit any fluid or breath 52 that passes through the sensor 50 to freely flow away from the sensor 50 via the hole 55. In embodiments of the present invention, the system may also be mounted, for example, on a small (e.g., 2 cm² or so) board on which is mounted, side by side for example, a packaged processor or wireless/RF system.

One purpose of the package, such as the package or lid 32 of FIG. 3, is to protect and confine the components of the MEMS/MOEMS, including the fragile attach points of the paddles of the membrane layer. The package of a representative embodiment of the present invention may be made of a variety of products including, for example, plastic, ceramic or metal. In one representative embodiment, the package is made of Kovar™, a nickel-cobalt ferrous alloy, or plastic, and may be precision folded or injection molded. The package or lid of other representative embodiments of the present invention may be fabricated using laminate materials, so that the package or lid, and the sub or electrical and processing layer have matching coefficients of thermal expansion (CTEs).

As described above, the package of a fluid or breath sensor such as the sensors 30, 40, 50 also includes openings or inlets to allow the fluid or breath to enter the sensor. In one representative embodiment of the present invention, the openings or inlets expose as much of the paddles of the membrane layer outside of the sensor device as possible, while covering the spring attachment points of the paddles. In a representative embodiment of the present invention, the position of the openings or inlets maximizes the stress on the paddles, lever effect, and ease of stress, even when the user blows in a non-perpendicular way at the sensor device.

As noted above, a MEMS/MOEMS in accordance with a representative embodiment of the present invention may be designed as a "thru" system, in which the fluid or breath flows as freely as is possible through the device. Lid openings or inlets may assist to minimize the distribution of foreign air particles in between the lid and the paddles, such as by allowing only particles of a certain size to enter the sensor device. For example, one representative embodiment of the present invention has a tight gap (e.g., about 50 microns) that separates the lid and the paddles. Some representative embodiments of the present invention may have a slab of material (e.g., Silicon) of a thickness in the range of 10 to 50 microns with inlet holes of five microns or more, fabricated using Silicon processes, micro-machining, and/or laser etching techniques. Along with the openings or inlets, the system may include exhausts or vents which, individually or together with the inlets, prevent pressure build-up inside the system. This allows for the most replicable, linear and consistent mode of deflection for the paddles. Such a design also assists in reducing and dissipating condensation, and helps prevent the build-up of dust and lint, making the system "self-cleaning."

In a representative embodiment of the present invention, the position of the inlets and exhausts may help the fluid or breath flow easily in and out of the device upon applied pressure having deflected the paddles. The exhausts may be of dimensions proper to allow most common air particles to flow through (such as, for example, dust, smoke, cosmetics, hair, mist, etc.). In one representative embodiment of the present invention, four vents or exhausts are placed at the edges of the paddles. Depending on the overall manufacturing method, these openings may be fabricated in the one die used for the system or with holes drilled in the various layers. When fabricated as multiple layers, the layers are then stacked so that the vents or exhaust openings are aligned.

In a representative MOEMS embodiment of the present invention, the package, or at least the lid of the sensor, the top of the cavities layer 36, and the walls and bottoms of the cavities 36a, 36b, 36c, 36d, and 36e may be opaque to IR. It may also be opaque to ambient light in full. Further, physical features of the membrane, cavities, and electrical or processing layers, or corresponding elements in a sensor fabricated as a single piece, may be specifically designed to minimize leakage of IR or ambient light through the materials. For example, features of the paddles of the membrane layer, such as the geometry of the spring elements that attach the paddles 34a, 34b, 34c, 34d to the edge of the membrane layer 34 of FIG. 3, may be specifically designed to minimize leakage of IR between the infrared (IR) source 38e through the structure of the membrane layer 34 to the IR receivers 38a, 38b, 38c, and 38d. In another representative embodiment, the infrared portion of the ambient light may be used to complement the light generated by source(s) within the sensor 30 such as, for example, an IR source in cavity 36e.

As fluid or breath enters a sensor in accordance with a representative embodiment of the present invention, such as the sensors 30, 40 50 of FIGS. 3, 4, and 5, the fluid or breath displaces one or more paddles of the membrane layer. In light of the various conditions in which aspects of the current invention may be used, the paddle feature of the membrane layer may respond to pressures as low as, for example, 5-10 Pa, in the open space, at a distance. At such levels, paddle deflection may be in the order of no more than, for example, a few dozen microns, which allows for consistent return to rest and stability to shocks. As previously noted, the maximum amount of deflection of the paddles may be defined by the relative thicknesses of the paddle(s) and outer portion or "frame" of a membrane layer such as, for example, the paddles 34a, 34b, 34c, 34d of the membrane layer 34 of FIG. 3.

Figure 6:
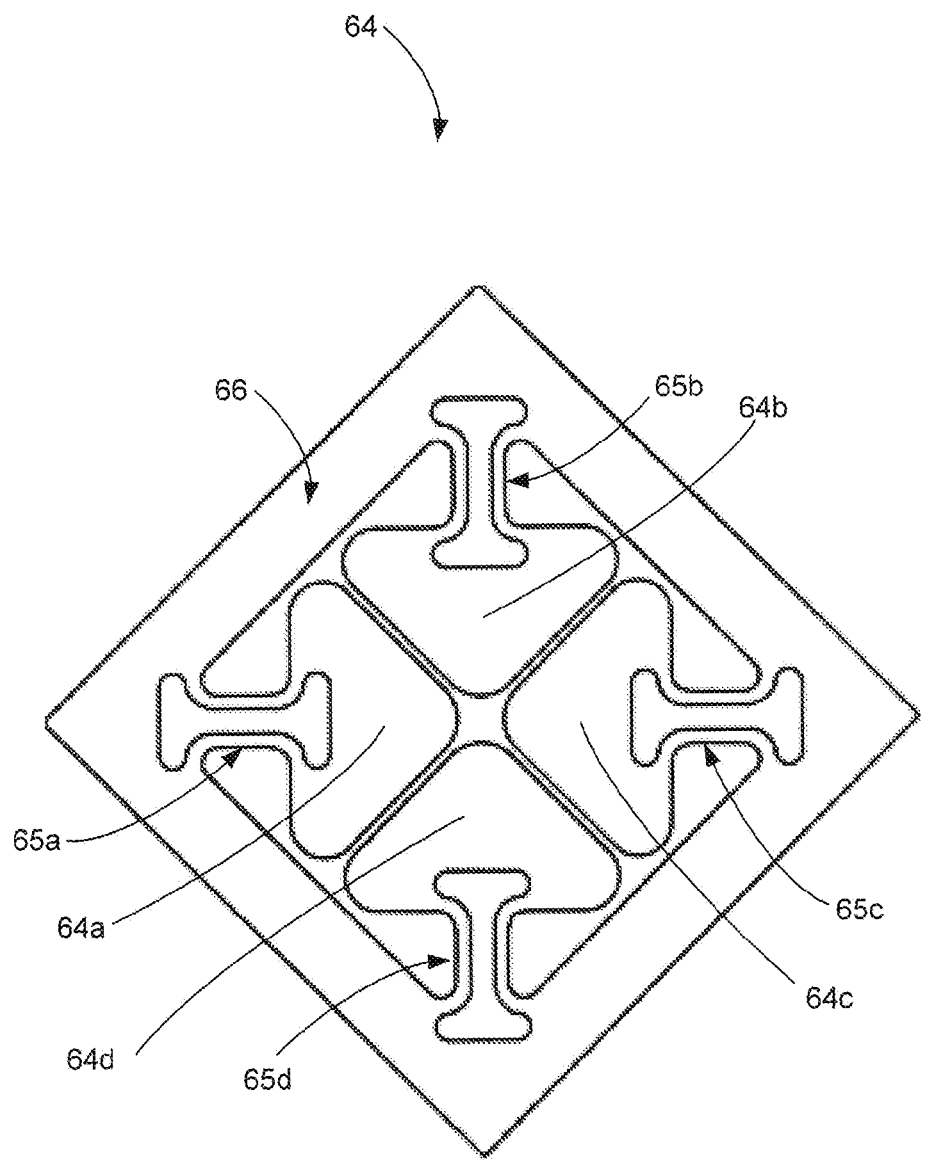
FIG. 6 illustrates a top-view of one possible construction of the elements of an exemplary membrane layer of a fluid or breath sensor such as, for example, the sensors of FIGS. 2, 3, 4, and 5, in accordance with a representative embodiment of the present invention.

FIG. 6 illustrates a top-view of one possible construction of the elements of an exemplary membrane layer 64 of a fluid or breath sensor such as, for example, the sensors 20, 30, 40, 50 of FIGS. 2, 3, 4, and 5, in accordance with a representative embodiment of the present invention. As shown in the example of FIG. 6, the membrane layer 64 comprises four paddles 64a, 64b, 64c, and 64d that are attached in cantilever fashion to a frame 66 using springs 65a, 65b, 65c, and 65d, respectively, at the attachment points. It should again be noted that the number of paddles and membrane layer elements may vary in various representative embodiments of the present invention depending on the application, processing method, etc., and that the number of paddles and springs, and the relative sizes of the paddles do not necessarily represent specific limitations of the present invention. For example, a representative embodiment of the present invention may use three paddles, and the paddles may be of different sizes. It should further be noted that in one representative embodiment of the present invention, the paddles 64a, 64b, 64c, 64d and other details of membrane layer 64 may be fabricated by etching, electroforming, and/or micro-machining out of the frame 66 which supports the paddles and absorbs shocks. The frame 66 of the membrane layer 64 may be attached to other elements of a sensor in accordance with a representative embodiment of the present invention such as, for example, the cavities layer 36 and/or electrical and processing layer 38 of FIG. 3, by any suitable method (e.g., adhesive, bonding, etc.). In some representative embodiments of the present invention, the frame 66 enables placement of the membrane layer on top of the electrical and processing layer, and may be arranged to electrically interconnect elements of the membrane layer with elements of the electrical and processing layer (e.g., in embodiments in which piezoelectric media is employed in the elements of the membrane layer). One representative embodiment of the present invention uses a membrane layer having four-paddles that are electroformed in nickel alloy with a spring design cantilever, in which the outer dimension of the frame is 7×7 mm and the thickness of the frame is about 200 microns. The paddles of such an embodiment may be, for example, about 15-20 microns thick. It should be noted that other representative embodiments of the present invention may have a frame having different dimensions, which may have a greater or lesser number of paddles that are thicker or thinner than the above example, without departing from the spirit and scope of the present invention. The arrangement, number, and size of the elements of various representative embodiments of the present invention may depend on the specific application.

In one MOEMS embodiment, no interconnect is needed between the membrane layer 64 and the electrical components of, for example, an electrical and processing layer such as electrical and processing layer 38 of FIG. 3. However, other representative embodiments, such as those employing piezoresistive elements to sense or detect movement or pressure, may utilize an electrical interconnect for the transfer of signals. In one representative MOEMS embodiment of the present invention, elements of the membrane layer (e.g., each of the paddles of FIG. 3 and FIG. 6) work as a light shutter or attenuator upon deflection that occurs when a force is applied on all or part of the stressable area. As such, the material from which the elements of the membrane layer are fabricated may be reflective to IR (or to whatever specific light source is used).

Figure 7A:
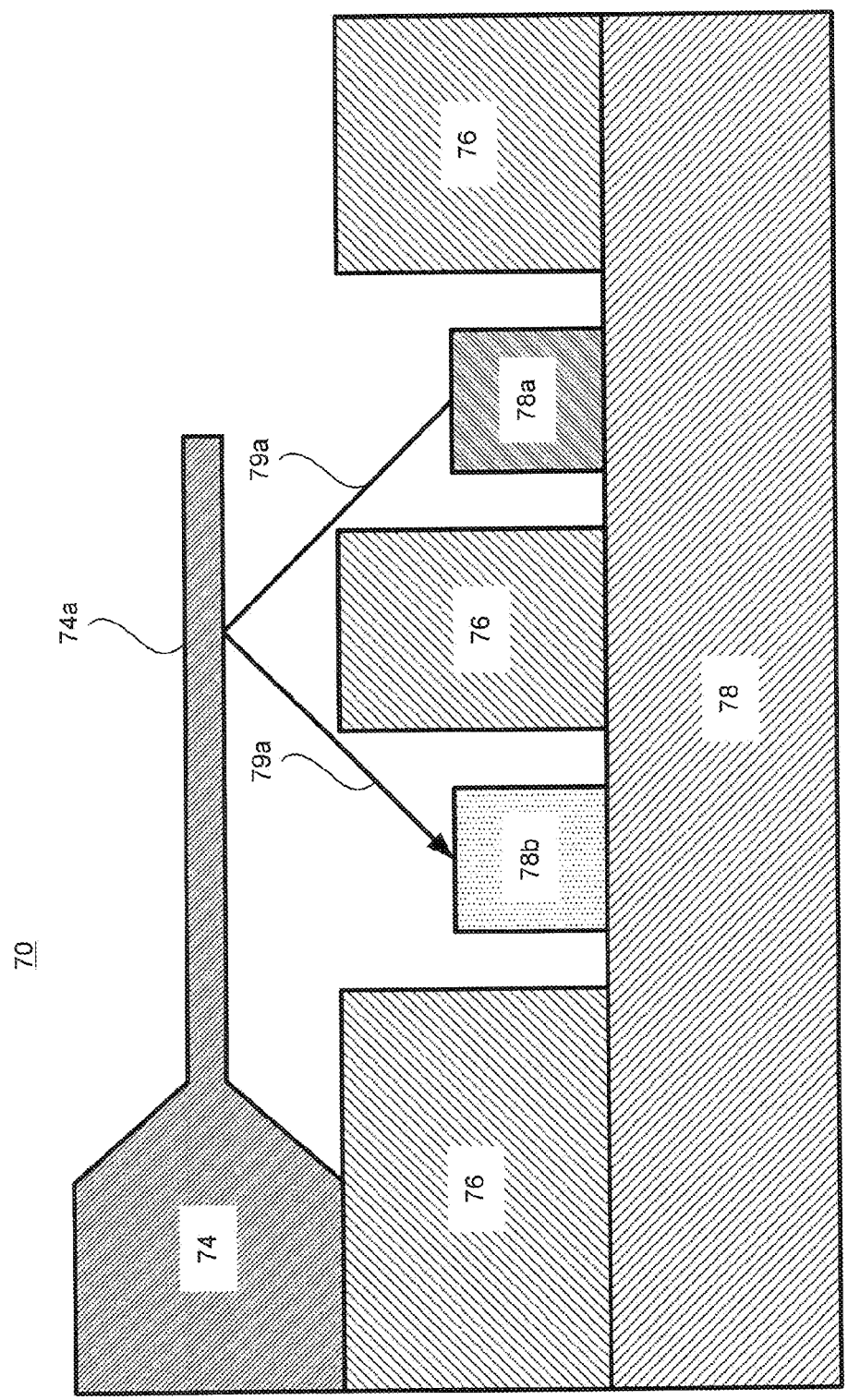
FIG. 7A shows a cut-away view of a portion of an exemplary sensor illustrating the rest or idle position of a paddle element of a membrane layer in relation to a cavities layer and an electrical and processing layer, which may correspond to, for example, the paddle of the membrane layer, the cavities layer, and the electrical and processing layer, respectively, of FIG. 3, in accordance with one representative embodiment of the present invention.

FIG. 7A shows a cut-away view of a portion of an exemplary sensor 70 illustrating the rest or idle position of a paddle element 74a of a membrane layer 74 in relation to a cavities layer 76 and an electrical and processing layer 78, which may correspond to, for example, the paddle 34a of the membrane layer 34, the cavities layer 36, and the electrical and processing layer 38, respectively, of FIG. 3, in accordance with one representative embodiment of the present invention. The representative embodiment shown in the example of FIG. 7A further comprises an IR source 78a that produces IR emission 79a. In one representative embodiment of the present invention, the IR emission 79a is maximally reflected by the underside of paddle 74a to an IR receiver 78b when paddle 74a is in the rest or idle position. The IR receiver 78b is blocked from receiving direct emissions from the IR source 78a by the intervening material of the cavities layer 76. In a representative embodiment of the present invention, the IR source 78a and the IR receiver 78b may be attached to the electrical and processing layer 78 in the form of bare die, or one or both of the IR source 78a and the IR receiver 78b may be fabricated as a region of the material used to create the electrical and processing layer 78. It should be noted that bare LED die such as silicon have very high refractive index compared to open air (e.g., a 4 to 1 ratio). Therefore, LED semiconductor chips used in the design of the MOEMS described herein tend to emit perpendicular to the surface of the die, with a cone shape, and thus to that of the paddles, at rest.

Figure 7B:
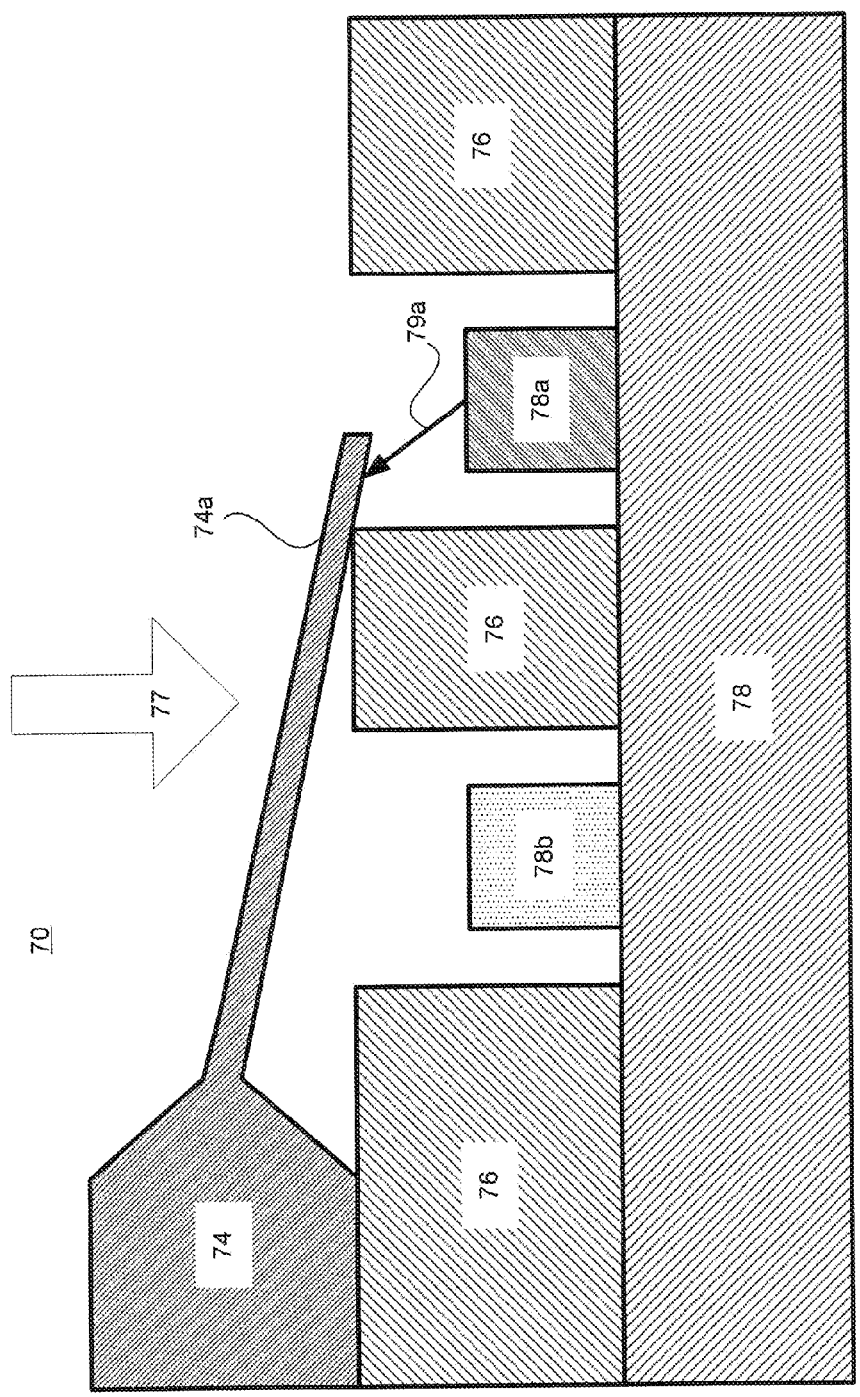
FIG. 7B shows another cut-away view of the portion of the exemplary sensor of FIG. 7A, illustrating deflection of the paddle element of the membrane layer due to flow of fluid or breath, in accordance with a representative embodiment of the present invention.

FIG. 7B shows another cut-away view of the portion of the exemplary sensor 70 of FIG. 7A, illustrating deflection of the paddle element 74a of the membrane layer 74 due to flow of fluid or breath 77, in accordance with a representative embodiment of the present invention. As shown in FIG. 7B, and previously described above with respect to FIG. 3, the flow of fluid or breath 77 results in deflection of the paddle 74a in an amount that depends upon the force imparted upon the paddle 74a. In the illustration of FIG. 7B, the force of such flow is sufficient to cause the IR emission 79a of the IR source 78a to be blocked by the underside of paddle 74a, resulting in no IR energy reaching the IR receiver 78b. It should be noted that although FIG. 7B shows complete blockage of the IR emission 79a of the IR source 78a that may occur when the force due to fluid or breath 77 is sufficient to move the paddle 74a into the position shown, this does not represent a specific limitation of a fluid or breath sensor in accordance with a representative embodiment of the present invention. A representative embodiment of the present invention is capable of producing an analog signal from the IR receiver 78b that varies in relation to the force applied to the paddle 74a by varying levels of pressure due to the flow of fluid or breath upon the sensor 70.

It should be noted that although the illustration of FIGS. 7A and 7B show a sensor in which a relative maximum of reflectance or transmission of IR energy between an IR source and an IR receiver occurs at a rest or idle position of the paddle element (when no flow of fluid or breath is present), such an arrangement does not necessarily represent a specific limitation of the present invention. The elements of various representative embodiments of the present invention may also be arranged so that a first relatively higher level of reflectance or transmission of IR energy occurs at a first non-zero level of flow of fluid or breath upon sensor 70, and a second relatively lower reflectance or transmission of IR energy occurs at a second relatively lower or zero flow of fluid or breath upon sensor 70. Such arrangements may be used for a number of purposes such as, for example, a Boolean interaction (e.g., a switch used to "click" or select), or to move in depth (i.e., in a 3D user interface) or to "zoom."

It should also be noted that although FIGS. 7A and 7B illustrate only a single paddle, a single IR source, and a single IR receiver, this is solely to simplify understanding, and does not necessarily represent a specific limitation of a representative embodiment of the present invention. As previously mentioned, a fluid or breath sensor in accordance with a representative embodiment of the present invention may have a greater number of paddles and corresponding IR source and IR receiver structures. Further, it should be noted that the illustrations of FIGS. 7A and 7B are not meant to suggest that each IR receiver is required to have a separate IR source. Fluid or breath sensor arrangements having a separate IR source for each paddle and IR receiver, as well as sensor arrangements in which a common IR source illuminates and is reflected by each of multiple paddles to corresponding IR receivers, are both in accordance with representative MOEMS embodiments of the present invention. In a representative having two or more paddles, for example, the paddles may be illuminated by a common source, and the paddles may be separated from one another by less than 50 microns.

Figure 8:
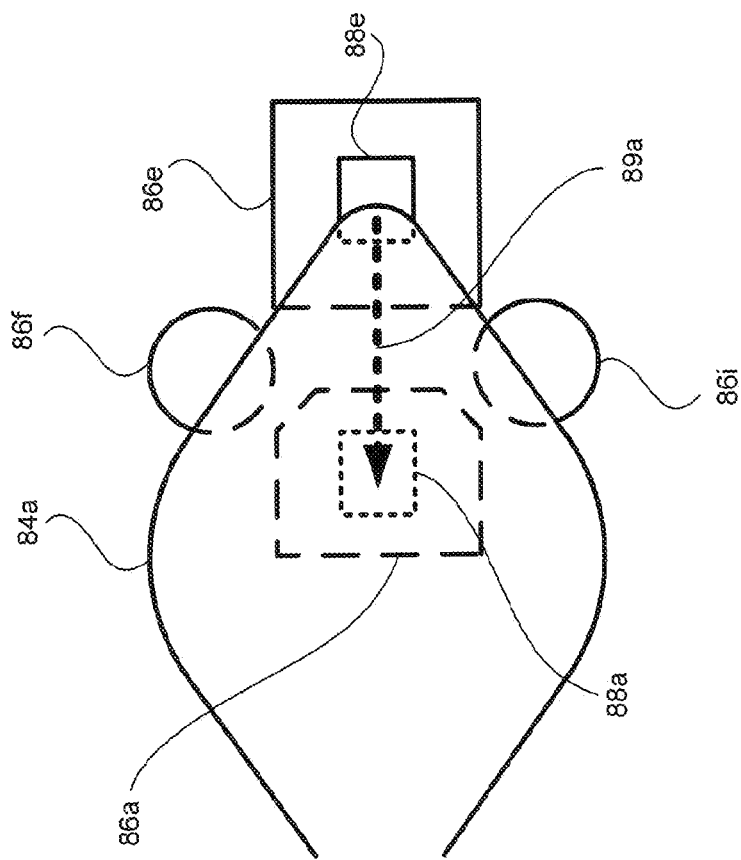
FIG. 8 illustrates a top down view of one paddle 84a of a membrane layer of a sensor such as, for example, one of the paddles of the membrane layer of the sensor of FIG. 3, in relation to features of an underlying cavities layer such as the cavities layer of the sensor of FIG. 3, in accordance with a representative embodiment of the present invention.

FIG. 8 illustrates a top down view of one paddle 84a of a membrane layer of a sensor 80 such as, for example, one of the paddles 34a, 34b, 34c, 34d of the membrane layer 34 of the sensor 30 of FIG. 3, in relation to features of an underlying cavities layer such as the cavities layer 36 of the sensor 30 of FIG. 3, in accordance with a representative embodiment of the present invention. The illustration of FIG. 8 shows the relative alignment of the paddle 84a with cavities 86a, 86b that may correspond to, for example, the paddle 34a and cavities 36a, 36b of the cavities layer 36, respectively, of FIG. 3. As previously described with respect to the illustration of sensor 30 of FIG. 3, the cavities layer 36 may include cavities 36a, 36b that surround and optically isolate direct transmission of IR energy from an IR source 88a to an IR receiver 88b, respectively, attached to or fabricated as a part of an electrical and processing layer located beneath the cavities layer, such as the electrical and processing layer 38 of FIG. 3, or the electrical and processing layer 78 of FIGS. 7A and 7B. In the illustration of FIG. 8, the direction of displacement of the paddle 84a due to the force of flow of fluid or breath upon the sensor element 80 of FIG. 8A is perpendicular to the plane of the drawing.

In addition, FIG. 8 shows vents 86f and 86g that may correspond to, for example, the vents 36f and 36g of the cavity layer 36 of FIG. 3. FIG. 8 also illustrates an IR source 88a and an IR receiver 88b, which may correspond to, for example, the IR source 38a and the IR receiver 38b of the sensor 30 of FIG. 3, or the IR source 78a and the IR receiver 78b of the sensor 70 of FIGS. 7A and 7B. The arrow 89a of FIG. 8 represents the path of the portion of the IR emission of the IR source 88a that is reflected by the underside of the paddle 84a and received by the IR receiver 88b.

FIG. 9 illustrates another exemplary arrangement of a sensor 90 for detecting the flow of fluid or breath, in accordance with a representative embodiment of the present invention. As shown in FIG. 9, the sensor 90 includes a package or lid 92 and a membrane layer or element 94, which are similar to the package or lid 32 and the membrane layer 34 of the sensor 30 of FIG. 3. The package or lid 92 includes a number of openings that provide for the flow of fluid or breath into the sensor 90, which then is detected as movement of displaceable reflective elements or "paddles" of the membrane layer 94. As noted above, the paddles of the membrane layer 94 in their rest, undisturbed, or un-deflected position lie substantially in the same plane as that of the membrane layer 94.

The layer immediately below the membrane layer 94 is a cavities layer 96 that may include, for example, a number of cavities that separate light source(s) and receiver(s). The cavities layer 96 of FIG. 9 is similar to, for example, the cavities layer 36 of the sensor 30 of FIG. 3. The cavities may be positioned in the x and y plane relative to displacement of the paddles of the membrane layer 94, and hence light reflection patterns between the light source(s) and receiver(s) within the cavities. As previously shown and discussed with respect to FIG. 8, above, a light source cavity may be designed to allow optimal distribution of light on the tips of the paddles of the membrane layer 94, and hence, maximum reception by the receiver(s) at rest position of the paddle. In a representative embodiment of the present invention, the cavities may be arranged so as to block and prevent light transmission (e.g. IR) within a substrate or electrical and processing layer, so that light may only either be emitted or received inside the cavities via their top opening. In the case of a laminate substrate, various processes may be implemented to enable such features. For example, cavities may be fabricated in laminates that are formulated to absorb or reflect IR, and portions of the cavity walls may be patterned with metals (e.g., copper). The cavities layer 96 may also be designed to optimize the paddle stop, and to help prevent fatigue, chipping, and permanent deformation of the mechanical components. The dimensions of the cavities of the cavities layer 96 in various representative embodiments of the present invention may vary depending on system implementation such as, for example, whether digital or analog interaction is sought, that is, whether the output signal(s) from sensor 90 should be Boolean (0 or 1), where the paddles of the membrane layer 94 act as shutters/switches, or variable, where the paddles of the membrane layer 94 deliver variable output, whether linear or not.

In one representative embodiment, the cavities of the cavities layer 96 have a depth of, for example, 500 microns, which includes, for example, the height of die attach paste, the bare die thickness, the loop height of the wire bond used to connect the bare die to the element/layer to which the bare die is attached, and a small thickness of IR transparent encapsulant. The encapsulant may be used to protect the apex of the wire bond so as to avoid any direct contact of wire with the back of the paddles of the membrane layer 94. If used, each cavity may be filled with enough IR transparent encapsulant so as not to protrude from the top edge of the cavity, in order to properly stop the paddles. The shrinkage/expansion of the encapsulant may be controlled so as not to allow condensation to generate excess humidity in the cavities (e.g. to avoid permitting condensation to run on the inside walls of a cavity due to shrinkage of encapsulant).

In some representative embodiments, an alternative option to filling cavities with encapsulant may be used in which precision molding techniques inject encapsulant with extremely low viscosity at high and well controlled temperature. The small depth of the cavities in some representative embodiments of the present invention makes it important to precisely control dispensing of encapsulant, and to monitor/control its behavior after curing and after mounting of the sensor 90 (e.g., as a SMD) in the system in which the sensor 90 is used. The encapsulant may be chosen and the sensor 90 may be produced so as to make sure that the encapsulant will not blur or yellow during aging.

As described herein, a MEMS/MOEMS in accordance with a representative embodiment of the present invention may be assembled onto a laminate substrate built specifically to meet electrical, optical, and other requirements, and as a result may involve the assembly of various parts such as, for example, one or several bare die chip(s), packaged component(s), deflectable member(s), slab(s), substrates, electrical circuitry, and lid(s). Although every effort may be focused on limiting the number of such separate parts, fabrication of a representative embodiment of the present invention remains cost-effective with designs having a number of components.

As a result of the use of multiple elements, several adhesives, sealants, encapsulants, may be utilized in the fabrication of some representative embodiments of the present invention. Each of these materials may have its own spatial distribution of moisture, curing requirements, and temperature cycles, for example. An important aspect of such assembly is to combine the use of these many products, while controlling the number of curing cycles, and particularly keeping them to a minimum to prevent excessive shrinkage, cracking and other issues that occur upon successive temperature elevations.

The fabrication of one MEMS/MOEMS in accordance with a representative embodiment of the present invention may, for example, involve the assembly of five bare die chips (e.g., using die attach, wire bonding), four passive surface mount components (e.g., including small packages), their encapsulation, and the attachment of a nickel alloy member. In such a representative embodiment, final packaging may be processed so that it is streamlined into only two steps, including the dispensing of a hydrophobic coating.

Such an approach permits optimal control over shrinkage of materials and such issues, while at the same time ensuring that proper waterproofing and aging requirements are met.

In a manufacturing process in accordance with a representative embodiment of the present invention, at panel level, elements are picked, placed, attached and encapsulated/coated in just two steps. This due to a careful choice of products such as the adhesives and sealants used, but also the recourse to laminate for top packaging, so as to match coefficients of thermal expansion (CTEs), and maximize the choice of epoxies and curing methods. By performing in-depth analysis of appropriate material deposition and dispensing, characterization of the effect of step-curing, ramp curing, single intensity on polymerization shrinkage, and a thorough characterization of UV/temperature cycles, with repeated batch tests and using a thermal imaging camera, the applicant has determined that a single curing process may be used to cure several distinct products in one step, and before MEMS/MOEMS are singulated. Such a curing process in accordance with aspects of a representative embodiment of the present invention may occur after a peelable film has been placed on the outside planes of a panel, so as to prevent contamination during singulation and later surface mount assembly into a host system using, for example, ball grid array (BGA) techniques.

Although shrinkage of materials may be inevitable, it is of importance to control volume and surface integrity changes, to compare top and bottom hardness, to meet aging patterns requirements, and also to prevent shrinkage stresses, for example on wire bonds or frame members. Volume changes may be measured by percentages via equations such as percent of volume change equals deltaV (change in volume, using micrometer)/volume dispensed×100.

Among other methods that may be employed are dispensing speed/filler load, soft-start/increased cure time, in steps rather than linear (sequential phases), with max intensities in the 300 mw/cm$^2$ range.

The exemplary sensor 90 of FIG. 9 also includes a collection of passive electrical components 98a (e.g., resistors, capacitors, inductors, and the like). A variety of passive components can be used in the current system. For example, one could use a passive component in a packaged form (e.g. package size 0402 of size 0.04 in.×0.02 in (1.0 mm×0.51 mm)) or an embedded/inked component.

In addition, the exemplary sensor 90 of FIG. 9 includes a collection of optical bare die that may include, for example, an IR source and multiple IR receivers, which may correspond to, for example, the IR source 38e and IR receivers 36a, 36b, 36c, 36d of FIG. 3. A variety of light sources/receivers can be used in the current system. Suitable opto-receivers may automatically measure the intensity of light resulting from the deflection and/or oscillations and/or deformation of the paddles.

In a representative embodiment of the present invention, the light source(s) and receiver(s) may be isolated from one another by the cavities of the cavities layer 96, in that the material of the cavities layer 96, including the cavity walls and bottoms, may be opaque to the light emitted by the source used. The depth and dimensions of the cavities depend on the overall system size but, in some representative embodiments, may maximize the light reception by light receivers at the rest position of the paddles of the membrane layer 94. The arrangement and dimensions may also attenuate/block light upon displacement of the paddles, as is shown in FIGS. 7A and 7B, and discussed above.

FIG. 9 also illustrates an electrical and processing layer 98c, also referred to herein as an "electric sub", which may correspond to, for example, the electrical and processing layer 38 of the sensor 30 of FIG. 3. As illustrated in FIG. 9, the electrical and processing layer 98c has circuitry on a first layer 98d and a second layer 98e, that may be arranged as two surfaces of the electrical and processing layer 98.

Some representative embodiments of the present invention, such as those illustrated in FIG. 3 and FIG. 9, use a single central light source and one receiver per displaceable media or paddle of the membrane layer 94; however many other combinations may be implemented, with multiple sources, etc. One embodiment uses IR light, such as an IR LED, and four receiving phototransistors or photodiodes. In some representative embodiments, suitable optical elements may be fabricated using, for example, silicon doping techniques applied to a main silicon die that integrates the passive components and interconnect(s) with an ASIC. As noted above, the optical elements (i.e., the light source(s) and receiver(s)) may also be fabricated from a die attach/wire bonding process using bare die. In other representative embodiments of the present invention, packaged optical components may be used as well, provided that such components are small enough.

In one representative embodiment of the present invention, the overall geometry of the sensor 90 does not allow light to be distributed through the spring that attaches the paddle(s) to the frame of the membrane layer 94 such as, for example, the springs 65a, 65b, 65c, 65d of FIG. 6, so as to prevent noise that would disturb the signal(s) output by the receiver(s) when, for example, light bounces from one receiver's cavity to another, or simply the effects of ambient light. In a representative embodiment of the present invention, the package also does not reflect any light through the springs or the gaps surrounding the edges of the paddle(s). The tip area of every paddle may overlay with at least a portion of the light source cavity to optimize illumination of the receivers at idle status as illustrated, for example, in FIG. 8. Inlets or opening(s) in the package may be placed so as to maximize stress on the paddle(s), while limiting the amount of light pollution from ambient sources, even at full deflection of the paddles. As may be seen in FIG. 3 and FIG. 9, the optical components may be placed and configured such that the fluid or breath travels freely through the system.

It should be noted that although an optical configuration is employed in various representative embodiments of the present invention, because such a configuration tends to deliver "analog" ("warm") responses that easily turn into natural interaction, a sensor generating a digital signal (switch) may be processed and modeled so as to be felt by a user as natural as well.

In some representative embodiments of the invention, a substrate such as the electrical and processing layer 98 may be used as a soldering/surface mount support, in which case the package of each passive and optical component is attached (e.g., soldered or glued) onto the substrate. One representative embodiment of the current invention utilizes a thin FR-4 or aluminum substrate (e.g., an electric layout), which is opaque to IR frequencies, and also to ambient light. In some representative embodiments, such a substrate may have open cavities fabricated within it, and may include a shim on top of the substrate, in a panelized way, with the proper registration mechanisms. Such a substrate may be used as the back of the sensor device to avoid the costs related to additional packaging in this design.

Although a MEMS/MOEMS package in accordance with a representative embodiment of the present invention enables protection of all electrical components against oxidation and related contamination due to a tight encapsulation within cavities, moisture buildup from condensation may disturb the proper functioning of the MEMS/MOEMS when moving from freezing outdoor conditions into a warm, indoor atmosphere.

Among other solutions described herein, a MEMS/MOEMS package design in accordance with a representative embodiment of the present invention may have openings or inlets on one face and exhausts or outlets on another face, fully open to the surrounding environment, to significantly reduce functionality issues related to, for example, condensation, and in particular stiction, the force required to cause one body in contact with another to begin to move. Such a representative embodiment of the present invention acts in a way comparable to turning on ceiling fans, or opening windows to circulate the air and thus preventing condensation. When a user blows at a sensor device in accordance with a representative embodiment of the present invention, the device package enables adequate venting of the paddles, and hence thermal exchange with blown air as well as ambient air. Further, adequate venting of the top surface of the substrate, itself preferably coated with a hydrophobic material, helps to dissipate the potential effects of environments in which condensation is likely to occur, in a very minimal time and with suited effectiveness.

In a representative embodiment of the present invention, the substrate may be coated with a suitable hydrophobic coating to prevent stiction, the force required to cause one body in contact with another to begin to move. Such a coating may be applied following encapsulation of components attached to a substrate, such as the electrical and processing layer 98, for example. Condensation of water vapor on parts of a sensor such as the sensor 90 may occur, for example, when the MEMS/MOEMS is brought into an indoor environment after being used outside in a cold atmosphere, or when breath condenses on a device used outside in cold weather, such as in a handheld device like a smart phone. In such cases, a thin liquid layer between the paddles of a membrane layer (e.g., the paddles of the membrane layer 94), and a surface of a cavities layer or substrate (e.g. the cavities layer 96 or the and processing layer 98) may work as an adhesive. If the contact angle between a drop of the liquid and a solid is less than 90 degrees, the pressure inside the liquid drop will be lower than outside, and a net attractive force will be created. The amount of pressure difference may be given by the Laplace equation. The use of such coatings aims to produce a condition in which the fluid no longer wets the substrate, minimizing capillary forces needed to pull the paddles of the membrane layer into stiction and thus exhibiting lower adhesion. Suitable coatings for use in a representative embodiment of the present invention may include, for example, electronic-grade coatings, and self-assembled monolayers. Self-assembled monolayers organic molecules may be deposited onto the MEMS substrate with a thickness of a single molecule and controlled orientation. The MEMS device may embed, for example, gyroscopes, magnetometers, a wireless link, and breath analyzing technologies, whether for measurements related to the detection of illnesses or that of substances.

In some specific usage scenarios, such as high-humidity environments in which condensation may occur, a representative embodiment of the present invention may maintain the MEMS within a given temperature range, preferably close to that of the air exhaled by a human being. This goal may be met in various ways, which may be combined for optimal efficiency. For example, the volume in which paddles, such as paddles of the membrane layer 94 of FIG. 9 are being deflected, that is, the space between the bottom side of the package, top, or lid (e.g., package 92) and top of the substrate or membrane layer in a representative embodiment of the present invention, is in the order of 0.009 cubic centimeters or less. Within such a restricted volume, in a representative embodiment in which IR LED bare die are used as a light source for a MOEMS implementation, the conversion ratio of input power into IR radiation, on the one hand, and heat, on the other hand, may be leveraged, especially since the flat-surface of bare die tends to favor that a significant portion of all photons emitted gets turned to heat, these photons not being able to escape. In this regard, the choice of IR transparent encapsulant may also be made based on the ability for this material to act, more or less, as a refractive interface between the semiconductor die and the air.

In addition, a representative MOEMS embodiment of the present invention may have embedded a number of passive components such as, for example, resistors, whose generation of generate heat may be used, and input power as well as resistance values may be chosen accordingly. Additional, regulated, passive components may be integrated as well, for the sole purpose of aiding temperature control. In a representative embodiment of the present invention, these components may be chosen for their fast temperature rise during a voltage pulse, and based on their thermal resistance, i.e. ° C./watt generation.

In some representative embodiments of the present invention, a temperature sensor die may be integrated as well, within the MEMS package or in close proximity to it, in order to supply temperature data input to the ASIC, where firmware can adjust various parameters such as cycling frequency, voltage input and such.

In addition, more complex packages may be designed to trap heat excess. In one exemplary design, IR LED die may be assembled onto metal or other alloy-made leads or such fixtures conceived as heat sinks, enabling heat removal and repartition inside target areas within the MEMS package.

A representative embodiment of the present invention may take into account the overall thermal performance of all materials involved in the entire MEMS package so as to provide optimal performance of the system.

In a representative embodiment of the present invention, an ASIC may also be fabricated (e.g., using CMOS techniques), which may be attached to the sensor 90 in packaged form, as raw silicon (e.g. wafer-to-wafer), or mounted as a bare die (e.g., flip-chip manner). In representative embodiments in which an ASIC is attached to the MEMS/MOEMS in the form of a bare die, additional packaging and encapsulation may be used to protect the ASIC die and enable a surface mount utilizing, for example, flip-chip techniques.

The exemplary embodiment shown in FIG. 9 does not include an embedded ASIC, and hence, may output analog signals directly from the bare die of the photoreceiver(s) to be input into the processing system of a host device. The embodiment illustrated in FIG. 9 is arranged to be surface mounted onto a printed circuit board (PCB), shown in FIG. 9 as PCB 98b, via six pads (e.g., power, ground, and four output signals) in a manner also shown and described in greater detail, above, with regard to FIG. 5. As illustrated in FIG. 5 and FIG. 9, a printed circuit board on which the sensor 90 is to be mounted may be provided with a hole which permits the sensed fluid or breath to exit the system of the sensor 90, and the enclosure of the device in which the sensor 90 is employed may have openings that align with the inlets/openings of the package of sensor 90 (e.g., the openings of the package or lid 92 of FIG. 9), and may include a mesh, or other comparable design.

A number of additional features may be included in the processing related to certain representative embodiments of the present invention, which may include providing specific ports or outputs for electrical signals out of the ASIC. A few examples of such signals include those used to provide, for example, visual or aural output/feedback (e.g. wind sound), haptics (e.g. physical feedback in which a handheld phone gently "rattles" in response to a puff, etc.), matching all solutions aimed at reinforcing naturalness, or helping disambiguate.

Whether embedded in the system or not, an ASIC of some representative embodiments of the present invention may receive the output of the sensor 90 through analog to digital converter (A/D) inputs. Other ports or signal paths of the ASIC may be used for signals related to additional controls such as, for example, light source cycling (e.g., for power saving), idle/wake-up mode (e.g., in which the light source(s) are turned on and off at very low frequency, and receiver(s)/sensor(s) are read at very low frequency, to detect a user's intentional puffs and wake up a processor, thus reducing ASIC power consumption). Additional functions, external to the sensor 90, may also be enabled to make lights blink in the host device in which the sensor 90 is placed, or to trigger playback of sound files, etc.

It should be noted that a linear increase in pressure or flow of the sensed fluid or breath does not necessarily lead to a linear change in deflection/oscillation/deformation, and hence, in voltage output from a representative embodiment of the present invention. As a result, calibration techniques may be used to optimize responsiveness across the system of the sensor 90. For example, in some representative embodiments, calibration algorithms may be embedded in the ASIC included in the sensor 90. In other representative embodiments, such calibration algorithms may be included in the processing unit of the host system to which the sensor 90 is connected. Such calibration algorithms may help to compensate for the fatigue of stressable elements under environmental changes and over time, such as, for example, the paddles and springs of membrane layer 34, 94 of FIG. 3 and FIG. 9, respectively, as well as environmental changes (e.g., temperature, humidity), and to prevent the processing of invalid outputs resulting from physical shocks or other unintentional inputs such as, for example, ambient winds or coughs, to the sensor 90. A representative embodiment of the present invention may use a number of behavioral parameters that are stored or analyzed in real time (e.g., using "Artificial Intelligence"), to further strengthen these algorithms to make interaction decisions based on parameters that identify a user's typical and/or current usage (e.g., strong flow from close exhaling, weak flow traveling from a significant distance, flow arriving at an angle to the sensor, or flow sensed on a day where the user has breathing troubles). The linkage of all these analysis criteria allows a system employing a representative embodiment of the present invention to make pertinent decisions that yield the most intuitive and intentional interaction.

Upon one or several of the stressable elements (i.e., the paddle(s) of sensors such as sensor 30 of FIG. 3 or sensor 90 of FIG. 9) being deflected/deformed/turned to oscillation mode, the matching receiver output value(s) may change. Such value change(s), which may be input to an ASIC as an analog signal (e.g., a voltage), may be related to the duration of the change, the "slope" or rate of change, or the signal amplitude (e.g., partial attenuation, or deflection to full blocking of light). In a representative embodiment of the present invention, certain portion(s) or characteristics of the measured signal may be rejected or removed/modified by filtering, for example, to isolate noise from the signal.

The "vocabulary" of a user interface during operation of one representative embodiment of the present invention may include, but is not limited to: puffing across the sensor, from up to down, to indicate "scroll;" briefly puffing toward the MEMS/MOEMS with little or no up/down or left/right displacement of the flow of breath, to indicate "select;" and puffing across the sensor, left-to-right, with increased intensity/flow toward the right, followed by a slowing of movement, to indicate 3D displacement of a displayed screen element "farther toward the right." For example, additional elements of a user interface vocabulary may provide support for user control that allows a user to "zoom" an image or move through a 3D workspace space, and to "flip" or "deform" an image or element of an image. In applications other than "computerized" applications, for example in toys, this or other vocabularies may be used for limitless interactions. Such a user interface may also be leveraged in a number of industrial and medical applications where the ability to sense directional airflow (or other fluid flow) intensity may be interpreted in many ways.

The MEMS/MOEMS of a representative embodiment of the present invention may interact with the host system of the digital media. While the host system may receive unprocessed, raw output from a MEMS/MOEMS sensor such as sensors 30, 90 of FIG. 3 and FIG. 9, respectively (provided that enough ports are available on the host system to receive the output(s) of the sensor), it is preferred, though not required, that a representative embodiment of the MEMS/MOEMS described herein include its own embedded processor, so that the MEMS/MOEMS may be easy integrated into any host system.

A sensor in accordance with a representative embodiment of the present invention, examples of which are described herein, may be easily embedded in a broad diversity of form factors such as, but not limited to: headsets, standalone peripherals (e.g. desktop accessories), handsets (e.g., phones, tablets, portable game and multimedia devices), other handheld devices (e.g., remote controls, gaming devices), vertical displays (e.g., PCs, digital kiosks, ATMs), electronic toys, fabrics (e.g. shirt collars, jacket hoods, gloves), and even attached onto the human body (e.g., piercing, dental surgery). If placed within a particular form factor, the casing or enclosure of the host platform may have openings/holes that are matched to or aligned with the inlets or openings of a sensor such as those illustrated and described herein (e.g., in a cell phone enclosure, the holes or openings may be similar to what is found for speakers or microphones). In some representative embodiments, a grid/mesh may also be used, whether for aesthetic purposes of to improve environmental performance.

FIG. 10 is an illustration of a membrane layer 104 having four paddles 104a, 104b, 104c, 104d with corresponding spring elements 105a, 105b, 105c, 105d of a first exemplary arrangement, in accordance with one representative embodiment of the present invention. In the example illustrated in FIG. 10, the springs 105a, 105b, 105c, 105d appear as two independent elements, each of which is attached at one end to the frame of the membrane layer 104 and at the other end to an edge of the paddle 104a. The arrangement of the exemplary springs 105a, 105b, 105c, 105d of FIG. 10 optimizes paddle area and mass, and delivers more stability, in comparison to springs of other representative embodiments of the present invention.

FIG. 11 is an illustration of a membrane layer 114 having four paddles 114a, 114b, 114c, 114d having corresponding spring elements 115a, 115b, 115c, 115d of a second exemplary arrangement different from that of FIG. 10, in accordance with another representative embodiment of the present invention. In the example illustrated in FIG. 11, the springs 115a, 115b, 115c, 115d are arranged as side by side serpentine-shaped springs that include a number of voids, attaching each paddle to the frame of the membrane layer 114. As previously discussed, the shape of such springs may block reflection or passage of light from a light source of the sensor, or from ambient sources. The exemplary springs 115a, 115b, 115c, 115d illustrated in FIG. 11 consume more paddle area that the exemplary springs 105a, 105b, 105c, 105d of FIG. 10, and thus reduce stressable are as well as mass, yet enable use of longer springs. The greater length of the springs 115a, 115*b*, 115*c*, 115*d* may offer less stability that the examplary springs of FIG. 10. This seeming disadvantage may, in fact, be leveraged for finer interpretation of the intention of the user.

FIG. 12 is an illustration of a membrane layer 124 having four paddles 124*a*, 124*b*, 124*c*, 124*d* having corresponding spring elements 125*a*, 125*b*, 125*c*, 125*d* of a third exemplary arrangement different from that of those of FIGS. 10 and 11, in accordance with yet another representative embodiment of the present invention. The springs 125*a*, 125*b*, 125*c*, 125*d* of FIG. 12 are similar in design to those of FIG. 11, but have fewer loops and spring length, and hence may be more stable than the springs 115*a*, 115*b*, 115*c*, 115*d* shown in FIG. 11.

Figure 13:
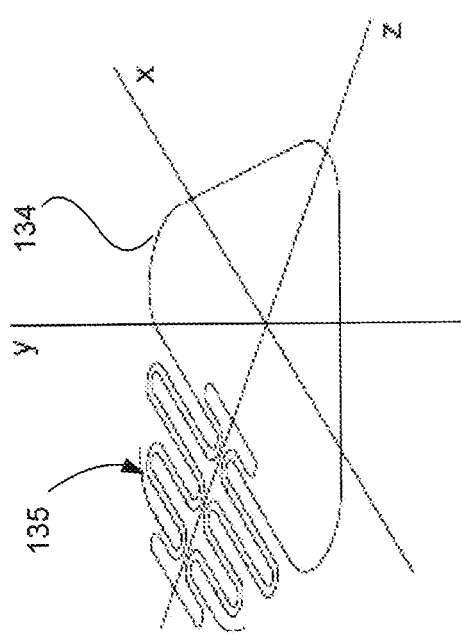
FIG. 13 is an illustration of an exemplary paddle and an associated spring in a rest or idle state showing degrees of freedom along reference x, y, and z-axes, in accordance with a representative embodiment of the present invention.

FIG. 13 is an illustration of an exemplary paddle 134 and an associated spring 135 in a rest or idle state showing degrees of freedom along reference x, y, and z-axes, in accordance with a representative embodiment of the present invention. In accordance with one representative embodiment of the present invention, the paddle 134, which may correspond to, for example, the paddles 114*a*, 114*b*, 114*c*, 114*d* of FIG. 11, may be considered as six degrees of freedom membranes (6 DOF), or rather, 5 DOF since deflection of the paddle 134 in the "y plus" direction may be blocked by the top, package, or lid of the sensor device, insofar as there may be a gap of a only a few dozen microns between the paddle 134 and the package or lid (not shown). The 5 DOF provided by one representative embodiment of the present invention are key to fine interpretation of user-generated inputs, in that, for example, light reflections obtained from a given paddle tilting while deflecting may allow more accurate interpretation of a users' intentions. As another example, since the paddles (e.g., 114*a*, 114*b*, 114*c*, 114*d* of FIG. 11 and paddle 134 of FIG. 13) may lay flat at the end of their downward travel, thanks to stretch of the spring 135 in the z dimension, such a representative embodiment permits optimal light attenuation. It should be noted that sensors in accordance with a representative embodiment of the present invention includes those in which motion of the paddles is limited to downside deflection as well.

Figure 14:
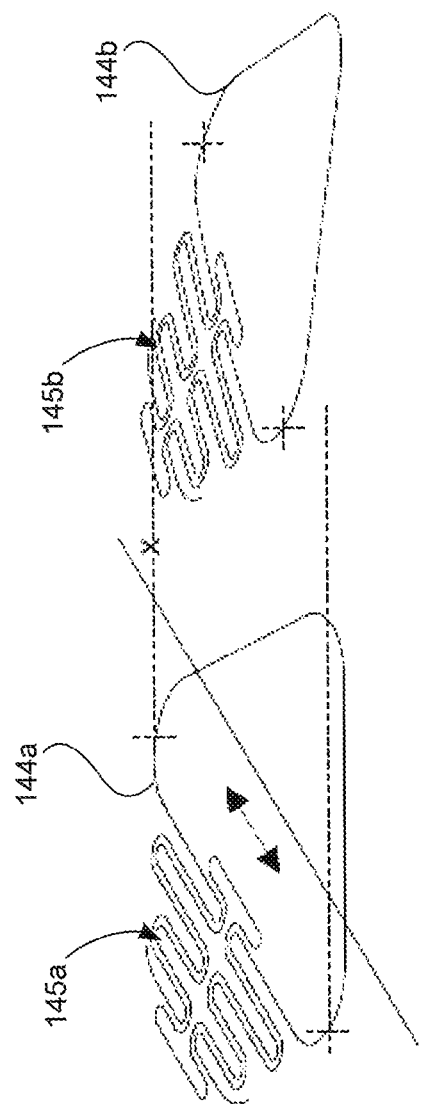
FIG. 14 shows an exemplary paddle and spring in a rest position illustrating degrees of freedom in the x dimension, and an exemplary paddle and associated spring illustrating how the paddles of a sensor such as, for example, the sensor of FIG. 9 may "tilt", in accordance with a representative embodiment of the present invention.

FIG. 14 shows an exemplary paddle 144*a* and spring 145*a* in a rest position illustrating degrees of freedom in the x dimension, and an exemplary paddle 144*b* and associated spring 145*b* illustrating how the paddles of a sensor such as, for example, the sensor 90 of FIG. 9 may "tilt", in accordance with a representative embodiment of the present invention. Such "tilt" may occur when, for example, the user blows across the device, say, with a "diagonal" trajectory of the airflow. Such deflection may of course happen simultaneous with a deflection along the y axis.

Figure 15:
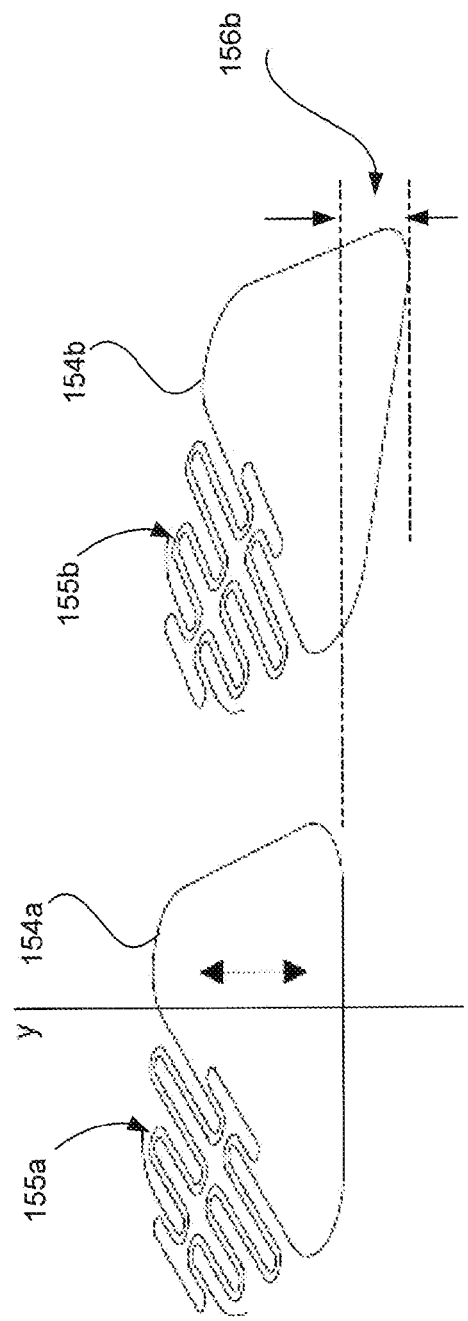
FIG. 15 illustrates an exemplary paddle and an associated spring in a rest position showing degrees of freedom in the y dimension, and an exemplary paddle and an associated spring illustrating deflection directly resulting from user-generated airflow, that is, in the y direction (y minus), in accordance with a representative embodiment of the present invention.

FIG. 15 illustrates an exemplary paddle 154*a* and an associated spring 155*a* in a rest position showing degrees of freedom in the y dimension, and an exemplary paddle 154*b* and an associated spring 155*b* illustrating deflection directly resulting from user-generated airflow, that is, in the y direction (y minus), in accordance with a representative embodiment of the present invention. Displacements in the y plus direction may occur, but may be limited by package or lid of the sensor.

Figure 16:
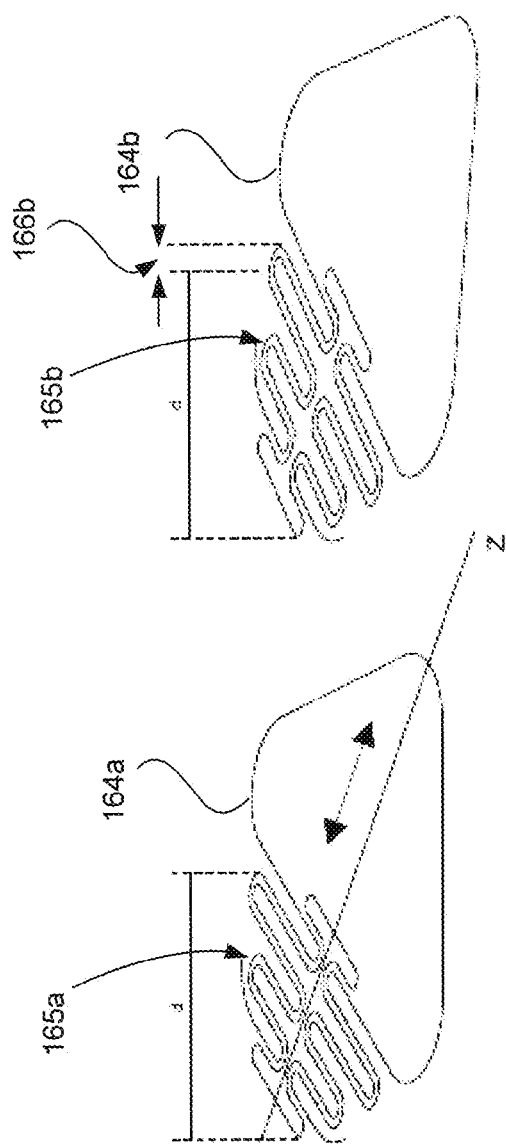
FIG. 16 shows an exemplary paddle and associated spring in a rest position illustrating degrees of freedom in the z dimension, and an exemplary paddle and an associated spring showing the type of stretch to which the paddles and springs are subjected, in accordance with a representative embodiment of the present invention.

FIG. 16 shows an exemplary paddle 164*a* and associated spring 165*a* in a rest position illustrating degrees of freedom in the z dimension, and an exemplary paddle 164*b* and an associated spring 165*b* showing the type of stretch to which the paddles and springs are subjected, in accordance with a representative embodiment of the present invention. Such stretching may occur, for example, when the pressure level of the airflow is high enough so as to "flatten" the paddle on the "sub" part of the MEMS.

As mentioned above, a MEMS sensor in accordance with representative embodiment of the present invention may be implemented using piezoresistive and capacitive designs as well.

In a representative embodiment employing a piezoresistive design, piezoresistive elements may be deposited on the edges of the deflectable member. In such an arrangement, the electrical resistance of the piezoresistive elements varies with the travel or deformation of the deflectable member.

In a representative embodiment employing a capacitive design, the deflectable member is one part or plate of a capacitor system, in which the other part or plate is attached to a fixed part or member such as, for example, the substrate (or wafer in the case of Silicon machining) of the MEMS. In such an arrangement, the electrical capacitance between the two parts or plates varies with distance changes between the two elements, that is, the deflectable member and the fixed part or member.

A representative embodiment of the present invention may also employ an interferometric design that may embed fiber optics in a deflectable member, so as to enable interaction based on light phase changes upon deflection or deformation of the deflectable member. The implementation of interferometric breath-sensitive interfaces, for example of the Mach-Zehnder type, may also facilitate the design of multiplex/distributed MOEMS, for example to be embedded into or on the edge of large, close-proximity digital displays such as those used at automated teller machines (ATMs) or digital kiosks, thus permitting a multi-sensor user interface.

However, the applicant believes that a MOEMS will generally be preferred due to the warmth of its response ("analog"), and its wide-bandwidth and immunity to electrical noise, and that IR sources will be preferred, possibly laser light in the IR region.

The fabrication of a MEMS/MOEMS sensor in accordance with a representative embodiment of the present invention may employ, for example, nanolithography processes such as NanoImprint Lithography (NIL), which permit the creation of high resolution patterns with monomer or polymer materials (formulations), and which may be fabricated with a broad range of specifications and characterization. NIL is well suited to electrical, optical, photonic devices and their integration with nano materials.

In accordance with a representative embodiment of the present invention, various NIL processes may be combined, such as, molding and ultraviolet (UV), with pattern transfer and deposition techniques, step-and-flash, breakthrough and transfer etch processes, as well as bottom up and top-down stamping (for example to form microfluidic channels) and other known or to be implemented techniques. This enables the design of both deflectable elements and printed circuits so that the a MEMS/MOEMS as herein described may be considered a nano-electromechanical system/nano-opto-electromechanical system (NEMS/NOEMS), and may pave the way to the integration of breath-controlled interfaces in a great diversity of target devices, such as clothing, digital paper, etc. Curing and release may be controlled by heat or UV light during the imprinting, and the expertise gathered in the development of the MOEMS may substantially apply to that of a NEMS (for example, to piezo-electric device), or a NOEMS.

Among other benefits, suitable membrane/cantilever materials may be made to match the exact requirements of size-to-sensitivity ratios, rather than the use of such materials as Silicon, which have specific characteristics and established processes. In the case of Silicon oxides and similar materials, a design must work around material specifications and suited processes. With nano materials and processes such as NIL, however, a material may be conceived to quite accurately match constraints such as, for example, paddle size. For example, when using Silicon, the size of a member may be restricted by various factors including, for example, a material's Young Modulus, processes reliability, and replicability costs. With nano materials and NIL one can define the ideal size a member should have and then elaborate formulation and design around this requirement, and thus overall device size, optical specifications (e.g. well controlled portions of a device with zero-reflectivity) integration requirements, such as flexibility in the case of clothing or digital paper, and even transparency, so as to reduce or eliminate occlusion, and embed the NEMS directly into any screen, for example in flexible digital screens where light sources may be conducted via fiber optics and other such methods such as on-chip optics. A number of grafting methods are being developed that enable the combination of a great diversity of materials within a NIL-based NEMS/NOEMS, for example, polymers onto nano-patterned surfaces, able to yield low-cost, high-efficiency packaging solutions.

NIL may be used to fabricate high resolution slabs, that is, airborne particles filtering at MEMS inlet's level, thanks to its ability to fabricate up to sub-10 nm nanofluidic channels.

NIL is also well suited to three-dimensional patterning, for example via ultraviolet curable nanoimprint lithography, which allows the design of deflectable members of high responsiveness and high sturdiness suitable for use in a representative embodiment of the present invention. This is due, in part, to the ability to manage varying thicknesses within one single member, to possibly reinforce areas of a spring, and fabricate a number of features which may deliver substantial benefits. 3D NIL will also help streamline manufacturing processes and shrinking device size by reducing or eliminating the need for level alignments between parts.

Another interesting possibility of NIL-fabricated NEMS/NOEMS in accordance with a representative embodiment of the present invention relates to its low cost and high throughput, which will permit the manufacture of disposable breath interfaces, a feature that is sought after in some application fields such as some medical devices.

Aspects of a representative embodiment of the present invention may be seen in a micro-electromechanical system for sensing flow of a fluid. Such a system may comprise a planar first layer comprising a first face, a second face, and a frame surrounding and supporting a plurality of paddles in cantilever fashion to enable independent deflection of the plurality of paddles. The system may also comprise a planar second layer comprising a first face, a second face, and a plurality of openings between the first face and the second face, where the first face of the planar second layer may be positioned adjacent to the second face of the planar first layer. The system may comprise a planar third layer comprising a first face positioned adjacent to the second face of the second layer and comprising one or more circuits for producing a plurality of signals responsive to deflection of the plurality of paddles. The system may also comprise a second face having conductive pads electrically coupled to receive the plurality of signals, and a plurality of openings between the first face and the second face, where the plurality of openings of the planar third layer may be aligned with the plurality of openings of the planar second layer. The system may further comprise a package enclosing the planar first layer, the planar second layer, and the planar third layer, where the package comprises a plurality of openings exposing the plurality of paddles to the fluid.

In various representative embodiments of the present invention, the fluid may be human breath, the flow of fluid from a source to the micro-electromechanical system may not be directed by a channel, and the plurality of paddles may comprise four paddles. The one or more circuits may be responsive to an amount of light reflected by the plurality of paddles, and the second planar layer may block direct transmission of light between at least one source and at least one receiver. The one or more circuits may comprise an application specific integrated circuit that outputs elements of a vocabulary of a user interface responsive to the deflection of the plurality of paddles. The package of such an embodiment may comprise molded plastic, and each of the plurality of paddles may undergo a deflection in the range of 24-200 microns when exposed to a pressure in the range of 5-10 Pa. The micro-electromechanical system may be arranged for attachment to a printed circuit board using surface mount techniques.

Aspects of a representative embodiment of the present invention may also be observed in a micro-electromechanical system for sensing flow of a fluid, where the system comprises a plurality of planar layers comprising a planar first layer comprising a frame surrounding and supporting a plurality of paddles in cantilever fashion to enable independent deflection of the plurality of paddles responsive to flow of the fluid. The plurality of planar layers may comprise a planar second layer. The second planar layer may comprise one or more circuits for producing a plurality of signals responsive to deflection of the plurality of paddles, and conductive pads electrically coupled to receive the plurality of signals. The system may also comprise a package comprising a plurality of openings exposing the plurality of paddles to the flow of the fluid, where the package encloses the plurality of layers and enables attachment of the micro-electromechanical system to a printed circuit board using the conductive pads.

In various representative embodiments of the present invention, the fluid may be human breath, the plurality of paddles may comprise four paddles, and the circuitry may be responsive to an amount of light reflected by the plurality of paddles. The flow of fluid from a source to the micro-electromechanical system may not be directed by a channel, and the plurality of layers may comprise a planar third layer that blocks direct transmission of light between at least one source and at least one receiver.

Further aspects of a representative embodiment of the present invention may be found in a micro-electromechanical system for sensing flow of a fluid, in which the system comprises a package comprising a first face and a second face. The first face may comprise a plurality of openings, where each opening exposes to the flow of the fluid a corresponding one of a plurality of movable paddles within the package. The system may also comprise a substrate comprising one or more circuits for producing a plurality of signals responsive to deflection of the plurality of paddles, one or more openings to allow fluid entering the package to escape, and a plurality of conductive pads electrically coupled to receive the plurality of signals. The plurality of conductive pads may enable attachment of the micro-electromechanical system to a printed circuit board.

In some representative embodiments of the present invention, the one or more circuits may comprise an application specific integrated circuit that outputs elements of a vocabulary of a user interface responsive to the deflection of the plurality of paddles. The one or more circuits may be responsive to an amount of light reflected by the plurality of paddles, and may comprise an application specific integrated circuit that outputs elements of a vocabulary of a user interface responsive to the deflection of the plurality of paddles.

Although a device, method, and system according to the present invention have been described in connection with the preferred embodiment, it is not intended to be limited to the specific form set forth herein, but on the contrary, it is intended to cover such alternative, modifications, and equivalents, as can be reasonably included within the scope of the invention as defined by this disclosure and appended diagrams.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A micro-electromechanical system for sensing flow of a fluid, the system comprising:
    a planar first layer comprising a first face, a second face, and a frame surrounding and supporting a plurality of paddles in cantilever fashion to enable independent deflection of the plurality of paddles;
    a planar second layer comprising a first face, a second face, and a plurality of openings between the first face and the second face, the first face of the planar second layer positioned adjacent to the second face of the planar first layer;
    a planar third layer comprising:
        a first face positioned adjacent to the second face of the second layer and comprising one or more circuits for producing a plurality of signals responsive to deflection of the plurality of paddles,
        a second face having conductive pads electrically coupled to receive the plurality of signals, and
        a plurality of openings between the first face and the second face, the plurality of openings of the planar third layer aligned with the plurality of openings of the planar second layer; and
    a package enclosing the planar first layer, the planar second layer, and the planar third layer, the package comprising a plurality of openings exposing the plurality of paddles to the fluid.

2. The micro-electromechanical system according to claim 1, wherein the fluid is human breath.

3. The micro-electromechanical system according to claim 1, wherein the flow of fluid from a source to the micro-electromechanical system is not directed by a channel.

4. The micro-electromechanical system according to claim 1, wherein the plurality of paddles comprises four paddles.

5. The micro-electromechanical system according to claim 1, wherein the one or more circuits are responsive to an amount of light reflected by the plurality of paddles.

6. The micro-electromechanical system according to claim 5, wherein the second planar layer blocks direct transmission of light between at least one source and at least one receiver.

7. The micro-electromechanical system according to claim 1, wherein the one or more circuits comprise an application specific integrated circuit that outputs elements of a vocabulary of a user interface responsive to the deflection of the plurality of paddles.

8. The micro-electromechanical system according to claim 1, wherein the package comprises molded plastic.

9. The micro-electromechanical system according to claim 1, wherein each of the plurality of paddles undergoes a deflection in the range of 24-200 microns when exposed to a pressure in the range of 5-10 Pa.

10. The micro-electromechanical system according to claim 1, wherein the micro-electromechanical system is arranged for attachment to a printed circuit board using surface mount techniques.

11. A micro-electromechanical system for sensing flow of a fluid, the system comprising:
    a plurality of planar layers comprising:
        a planar first layer comprising a frame surrounding and supporting a plurality of paddles in cantilever fashion to enable independent deflection of the plurality of paddles responsive to flow of the fluid;
        a planar second layer comprising a first face, a second face, and a plurality of openings between the first face and the second face, the first face of the planar second layer positioned adjacent to the second face of the planar first layer; and
        a planar third layer comprising:
            one or more circuits for producing a plurality of signals responsive to deflection of the plurality of paddles, and
            conductive pads electrically coupled to receive the plurality of signals; and
    a package comprising a plurality of openings exposing the plurality of paddles to the flow of the fluid, the package enclosing the plurality of layers and enabling attachment of the micro-electromechanical system to a printed circuit board using the conductive pads.

12. The micro-electromechanical system according to claim 11, wherein the fluid is human breath.

13. The micro-electromechanical system according to claim 11, wherein the plurality of paddles comprises four paddles.

14. The micro-electromechanical system according to claim 11, wherein the circuitry is responsive to an amount of light reflected by the plurality of paddles.

15. The micro-electromechanical system according to claim 11, wherein the flow of fluid from a source to the micro-electromechanical system is not directed by a channel.

16. The micro-electromechanical system according to claim 11, wherein the plurality of layers comprises a planar layer that blocks direct transmission of light between at least one source and at least one receiver.

17. A micro-electromechanical system for sensing flow of a fluid, the system comprising:
a package comprising:
a first face and a second face, the first face comprising a plurality of openings, each opening exposing to the fluid a corresponding one of a plurality of movable paddles within the package;
at least one planar layer comprising a first face, a second face, and a plurality of openings between the first face and the second face, the first face of the at least one planar layer positioned adjacent to the plurality of movable paddles; and
a substrate comprising:
one or more circuits for producing a plurality of signals responsive to deflection of the plurality of paddles;
one or more openings to allow fluid entering the package to escape, and
a plurality of conductive pads electrically coupled to receive the plurality of signals, the plurality of conductive pads enabling attachment of the micro-electromechanical system to a printed circuit board.

18. The micro-electromechanical system according to claim 17, wherein the one or more circuits comprise an application specific integrated circuit that outputs elements of a vocabulary of a user interface responsive to the deflection of the plurality of paddles.

19. The micro-electromechanical system according to claim 17, wherein the one or more circuits are responsive to an amount of light reflected by the plurality of paddles.

20. The micro-electromechanical system according to claim 17, wherein the one or more circuits comprise an application specific integrated circuit that outputs elements of a vocabulary of a user interface responsive to the deflection of the plurality of paddles.

* * * * *